(12) United States Patent
Yang

(10) Patent No.: US 11,114,448 B2
(45) Date of Patent: Sep. 7, 2021

(54) SEMICONDUCTOR DEVICE AND METHOD FOR FABRICATING THE SAME

(71) Applicant: NANYA TECHNOLOGY CORPORATION, New Taipei (TW)

(72) Inventor: Cheng-Ling Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 34 days.

(21) Appl. No.: 16/506,556

(22) Filed: Jul. 9, 2019

(65) Prior Publication Data

US 2021/0013217 A1 Jan. 14, 2021

(51) Int. Cl.
| | | |
|---|---|---|
| *H01L 27/112* | (2006.01) | |
| *H01L 23/522* | (2006.01) | |
| *H01L 23/525* | (2006.01) | |
| *H01L 23/532* | (2006.01) | |

(52) U.S. Cl.
CPC .... *H01L 27/11206* (2013.01); *H01L 23/5221* (2013.01); *H01L 23/5252* (2013.01); *H01L 23/53214* (2013.01); *H01L 23/53228* (2013.01); *H01L 23/53233* (2013.01); *H01L 23/53257* (2013.01)

(58) Field of Classification Search
CPC .................. H01L 27/11206; H01L 23/5221
See application file for complete search history.

(56) References Cited

U.S. PATENT DOCUMENTS

| 8,278,732 B1* | 10/2012 | Ho ..................... H01L 23/5252 |
| | | 257/530 |
| 2004/0016990 A1* | 1/2004 | Yang .................. H01L 23/5258 |
| | | 257/529 |
| 2004/0124538 A1* | 7/2004 | Reif .................... H01L 25/0657 |
| | | 257/774 |
| 2006/0163571 A1* | 7/2006 | Lim .................... H01L 21/8221 |
| | | 257/48 |
| 2007/0295949 A1* | 12/2007 | Lee ....................... H01L 45/126 |
| | | 257/4 |

(Continued)

FOREIGN PATENT DOCUMENTS

| TW | 201610991 A | 3/2016 |
| TW | 201816791 A | 5/2018 |
| WO | WO2019005156 A1 | 1/2019 |

OTHER PUBLICATIONS

Office Action issued in corresponding CN application No. 108127197 dated Jul. 15, 2020 (with abstract English translation attached).

*Primary Examiner* — Khaja Ahmad
*Assistant Examiner* — Khatib A Rahman
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate having a first region and a second region, a first semiconductor element positioned in the first region of the substrate, a second semiconductor element positioned in the first region of the substrate, a bridge conductive unit electrically connected the first semiconductor element and the second semiconductor element, and a programmable unit positioned in the second region and electrically connected to the bridge conductive unit.

8 Claims, 21 Drawing Sheets

(56) References Cited

U.S. PATENT DOCUMENTS

| | | | |
|---|---|---|---|
| 2008/0042243 A1* | 2/2008 | Lee | H01L 45/1683 |
| | | | 257/613 |
| 2009/0045386 A1* | 2/2009 | Chen | H01L 45/06 |
| | | | 257/3 |
| 2009/0160066 A1* | 6/2009 | Ikeda | H01L 23/525 |
| | | | 257/777 |
| 2010/0163828 A1* | 7/2010 | Tu | H01L 27/2409 |
| | | | 257/3 |
| 2011/0084248 A1* | 4/2011 | Hsieh | H01L 45/147 |
| | | | 257/4 |
| 2011/0266603 A1* | 11/2011 | Nakamura | H01L 27/10897 |
| | | | 257/306 |
| 2012/0126394 A1* | 5/2012 | Huang | H01L 24/92 |
| | | | 257/737 |
| 2016/0276156 A1* | 9/2016 | Kung | H01L 21/76855 |
| 2019/0113562 A1* | 4/2019 | Bonart | G01R 31/74 |

\* cited by examiner

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device with a programmable unit and a method for fabricating the semiconductor device with the programmable unit.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet increasing demands of computing ability. However, a variety of manufacturing issues arise during the down-scaling process and impact the final electrical characteristics, quality, and yield. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate having a first region and a second region, a first semiconductor element positioned in the first region of the substrate, a second semiconductor element positioned in the first region of the substrate, a bridge conductive unit electrically connected to the first semiconductor element and the second semiconductor element, and a programmable unit positioned in the second region and electrically connected to the bridge conductive unit.

Another aspect of the present disclosure provides a semiconductor device including a substrate having a first region and a second region, a first semiconductor element positioned in the first region of the substrate, a second semiconductor element positioned in the first region of the substrate and electrically coupled to the first semiconductor element, and a programmable unit positioned in the second region and electrically connected to the first semiconductor element.

Another aspect of the present disclosure provides a method for fabricating a semiconductor device including providing a substrate, forming a first semiconductor element and a second semiconductor element above the substrate, forming a plurality of insulating layers, a bridge conductive unit, a plurality of conductive layers, and a programmable unit above the substrate. The plurality of insulating layers are stacked on the substrate layer by layer, the bridge conductive unit is formed in a bottom one of the plurality of insulating layers and is electrically connected to the first semiconductor element and the second semiconductor element, the plurality of conductive layers are formed among the plurality of insulating layers and are electrically connected to the first semiconductor element and the second semiconductor element, and the programmable unit is formed in one of the plurality of insulating layers and is electrically coupled to the bridge conductive unit.

Due to the design of the semiconductor device of the present disclosure, a user may control or overwrite signal status through a programming procedure. In addition, a user may also tune the electrical characteristics of the semiconductor device through the programming procedure. Therefore, the quality of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
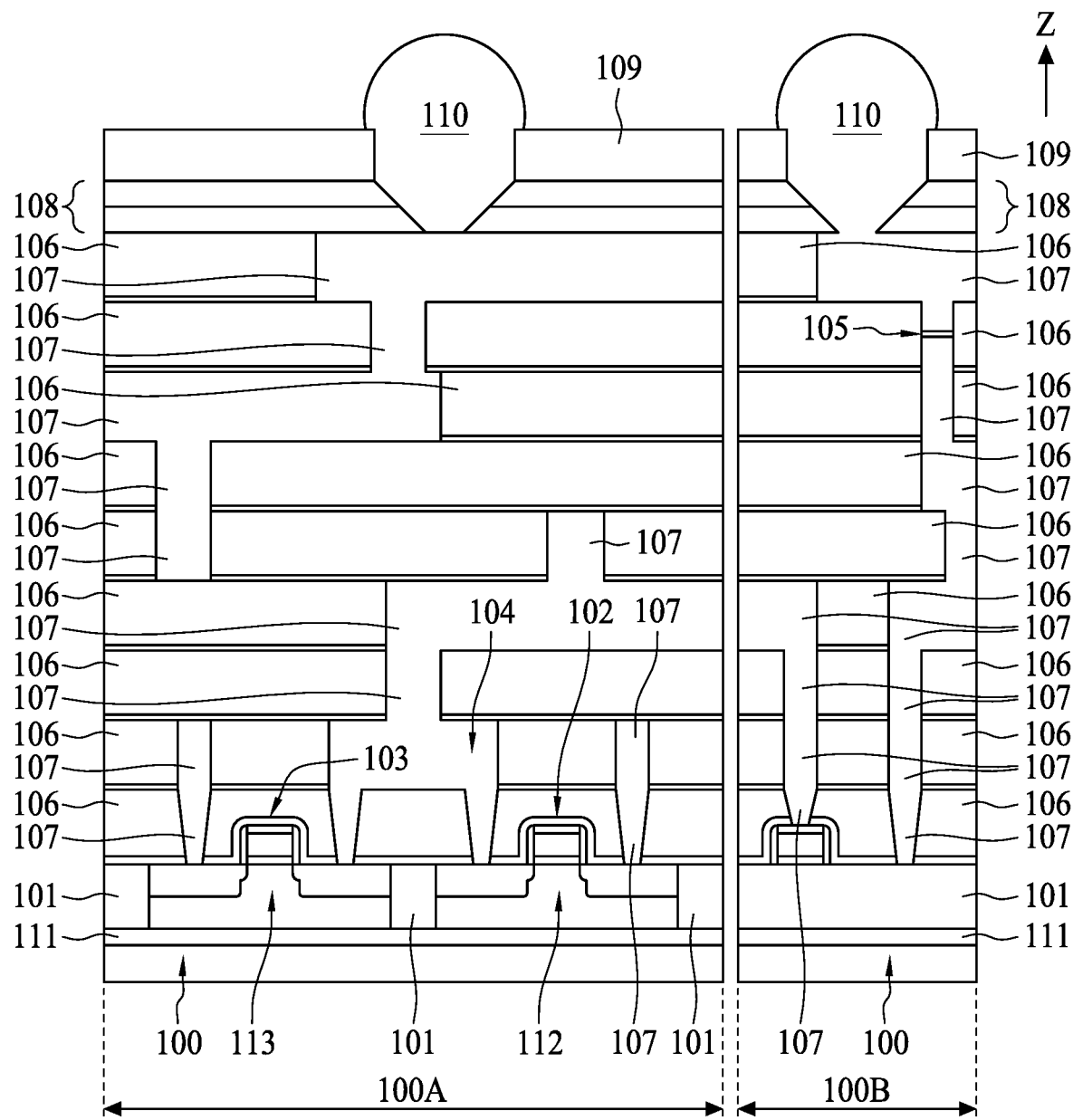
FIGS. 1 to 3 illustrate, in schematic cross-sectional diagrams, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

Note that, in the description of the present disclosure, above (or up) corresponds to the direction of the arrow of the direction Z, and below (or down) corresponds to the opposite direction of the arrow of the direction Z.

With reference to FIG. 1, the semiconductor device of the present disclosure includes, for example, a substrate 100, a plurality of isolation structures 101, a first semiconductor element 102, a second semiconductor element 103, a bridge conductive unit 104, a programmable unit 105, a plurality of insulating layers 106, a plurality of conductive layers 107, a passivation layer 108, a protection layer 109, and a plurality of solder units 110.

With reference to FIG. 1, the substrate 100 includes, for example, a first region 100A and a second region 100B. The first region 100A and the second region 100B may be adjacent to each other, or spaced apart from each other (e.g., spaced apart horizontally). The substrate 100 is formed of, for example, bulk silicon or silicon on insulator. In the embodiment depicted, the substrate 100 is formed of silicon on insulator with an insulating film 111, which divides the substrate 100 into an upper portion and a lower portion.

With reference to FIG. 1, the plurality of isolation structures 101 are respectively disposed in the first region 100A and the second region 100B of the substrate 100. The plurality of isolation structures 101 are disposed in the upper portion of the substrate 100; in other words, the plurality of isolation structures 101 are disposed above the insulating film 111. Some of the plurality of isolation structures 101 are separate from each other and define a first active area 112 and a second active area 113 in the first region 100A. The plurality of isolation structures 101 are formed of, for example, an insulating material such as silicon oxide, silicon nitride, silicon oxynitride, silicon nitride oxide, fluoride-doped silicate, or the like. The plurality of isolation structures 101 may be shallow trench isolation structures. In the embodiment depicted, the plurality of isolation structures 101 are formed of silicon oxide. The first active area 112 may be doped with a dopant such as phosphorus, arsenic, or antimony. The second active area 113 may be doped with a dopant such as boron.

Note that, in the present disclosure, silicon oxynitride refers to a substance which contains silicon, nitrogen, and oxygen, and in which a proportion of oxygen is greater than that of nitrogen. Silicon nitride oxide refers to a substance which contains silicon, oxygen, and nitrogen, and in which a proportion of nitrogen is greater than that of oxygen.

With reference to FIG. 1, the first semiconductor element 102 is disposed in the first region 100A. The first semiconductor element 102 is disposed above the insulating film 111 and is located in the first active area 112. The second semiconductor element 103 is disposed in the first region 100A. The second semiconductor element 103 is disposed above the insulating film 111 and is located in the second active area 113. The first semiconductor element 102 is disposed at a vertical level even with a vertical level of the second semiconductor element 103. The bridge conductive unit 104 is disposed in the first region 100A and is disposed above the substrate 100. The bridge conductive unit 104 electrically and physically connects the first semiconductor element 102 to the second semiconductor element 103.

Figure 2:
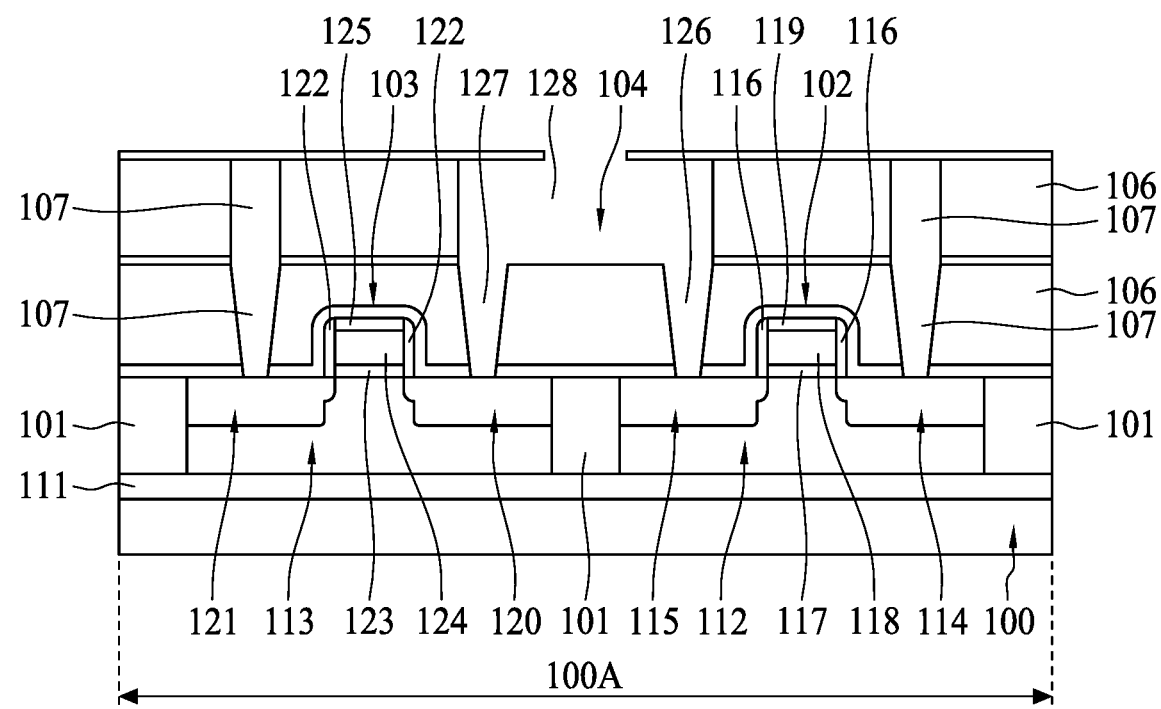

It should be noted that, for ease of explanation, FIG. 2 illustrates only the first semiconductor element 102, the second semiconductor element 103, and a portion of the semiconductor device.

With reference to FIG. 1 and FIG. 2, in the embodiment depicted, the first semiconductor element 102 includes a control structure, a first doped region 114, a second doped region 115, and two spacers 116. The control structure of the first semiconductor element 102 includes a gate insulating layer 117, a gate middle layer 118, and a gate top layer 119. The gate insulating layer 117 is disposed on the substrate 100 and has two sides. The gate middle layer 118 is disposed on the gate insulating layer 117. The gate top layer 119 is disposed on the gate middle layer 118. The first doped region 114 is disposed in the first active area 112 and is adjacent to one of the two sides of the gate insulating layer 117. The second doped region 115 is disposed in the first active area 112 and is adjacent to the other one of the two sides of the gate insulating layer 117. The first doped region 114 and the second doped region 115 are separate from each other. Each of the two spacers 116 is attached to one of the two sides of the control structure of the first semiconductor element 102.

The gate insulating layer 117 is formed of, for example, silicon oxide, silicon oxynitride, silicon nitride oxide, silicon nitride, or the like. In the embodiment depicted, the gate insulating layer 117 is formed of silicon oxide. The first doped region 114 and the second doped region 115 may be doped by a dopant which is different from the dopant used to dope the first active area 112. In the embodiment depicted, the first doped region 114 and the second doped region 115 are doped by boron. The two spacers 116 are formed of, for example, silicon oxide, silicon nitride, or the like. In the embodiment depicted, the two spacers 116 are formed of silicon oxide.

With reference to FIG. 1 and FIG. 2, in the embodiment depicted, the second semiconductor element 103 includes a control structure, a first doped region 120, a second doped region 121, and two spacers 122. The control structure of the second semiconductor element 103 includes a gate insulating layer 123, a gate middle layer 124, and a gate top layer 125. The gate insulating layer 123 is disposed on the substrate 100 and has two sides. The gate middle layer 124 is disposed on the gate insulating layer 123. The gate top layer 125 is disposed on the gate middle layer 124. The first doped region 120 is disposed in the second active area 113 and is adjacent to one of the two sides of the gate insulating layer 123. The second doped region 121 is disposed in the second active area 113 and is adjacent to the other one of the two sides of the gate insulating layer 123. The first doped region 120 and the second doped region 121 are separate from each other. Each of the two spacers 122 is attached to one of the two sides of the control structure of the second semiconductor element 103.

The gate insulating layer 123 is formed of, for example, silicon oxide, silicon oxynitride, silicon nitride oxide, silicon nitride, or the like. In the embodiment depicted, the gate insulating layer 123 is formed of silicon oxide. The gate middle layer 124 may be formed of polysilicon. The gate top layer 125 may be formed of metal silicide such as nickel silicide, platinum silicide, titanium silicide, molybdenum silicide, cobalt silicide, tantalum silicide, tungsten silicide, or the like. The first doped region 120 and the second doped region 121 may be doped by a dopant which is different from the dopant used to dope the second active area 113. In the embodiment depicted, the first doped region 120 and the second doped region 121 are doped by phosphorus. The two spacers 122 are formed of, for example, silicon oxide, silicon nitride, or the like. In the embodiment depicted, the two spacers 122 are formed of silicon oxide.

With reference to FIG. 1 and FIG. 2, in the embodiment depicted, the bridge conductive unit 104 includes a first bridge contact 126, a second bridge contact 127, and a bridge conductive layer 128. The first bridge contact 126 is electrically and physically connected to the second doped region 115 of the first semiconductor element 102. The second bridge contact 127 is electrically and physically connected to the first doped region 120 of the second semiconductor element 103. The bridge conductive layer 128 is disposed opposite to the substrate 100. The bridge conductive layer 128 electrically and physically connects the first bridge contact 126 to the second bridge contact 127.

The first bridge contact 126 is formed of, for example, tungsten or aluminum. The second bridge contact 127 is formed of, for example, tungsten or aluminum. The first bridge contact 126 and the second bridge contact 127 may be formed of the same material, but are not limited thereto. In the embodiment depicted, the first bridge contact 126 and the second bridge contact 127 are formed of tungsten. The bridge conductive layer 128 is formed of, for example, aluminum, tungsten, copper, or copper alloy. The copper alloy may be formed of copper and at least one of the elements selected from the group consisting of carbon, silver, zinc, aluminum, titanium, cobalt, tantalum, indium, tin, zinc, manganese, magnesium, chromium, germanium, strontium, platinum, and zirconium. In the embodiment depicted, the bridge conductive layer 128 is formed of copper.

With reference to FIG. 1 and FIG. 2, the plurality of insulating layers 106 are stacked on the substrate 100 layer by layer in both the first region 100A and the second region 100B. A bottom one of the plurality of insulating layers 106 encloses the first semiconductor element 102, the second semiconductor element 103, the first bridge contact 126, and the second bridge contact 127 in the first region 100A. The bottom one of the plurality of insulating layers 106 may be formed of silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. The remaining of the plurality of insulating layers 106 are formed of silicon oxide, silicon nitride, fluorinated silicate glass, or porous silicon oxide. The bottom one of the plurality of insulating layers 106 and the remaining of the plurality of insulating layers 106 may be formed of the same material, but are not limited thereto.

With reference to FIG. 1 and FIG. 2, in the embodiment depicted, the plurality of conductive layers 107 are disposed above the substrate 100 and are disposed among the plurality of insulating layers 106 in both the first region 100A and the second region 100B. The plurality of conductive layers 107 in the first region 100A and the plurality of conductive layers 107 in the second region 100B are electrically connected. Each of the bottom two of the plurality of conductive layers 107 is electrically and physically connected to both the first doped region 114 of the first semiconductor element 102 and the second doped region 121 of the second semiconductor element 103. The bottom two of the plurality of conductive layers 107 may be formed of aluminum or tungsten. The remaining of the plurality of conductive layers 107 are formed of, for example, aluminum, tungsten, copper, or copper alloy. The copper alloy may be formed of copper and at least one of the elements from the group consisting of carbon, silver, zinc, aluminum, titanium, cobalt, tantalum, indium, tin, zinc, manganese, magnesium, chromium, germanium, strontium, platinum, and zirconium.

Figure 3:
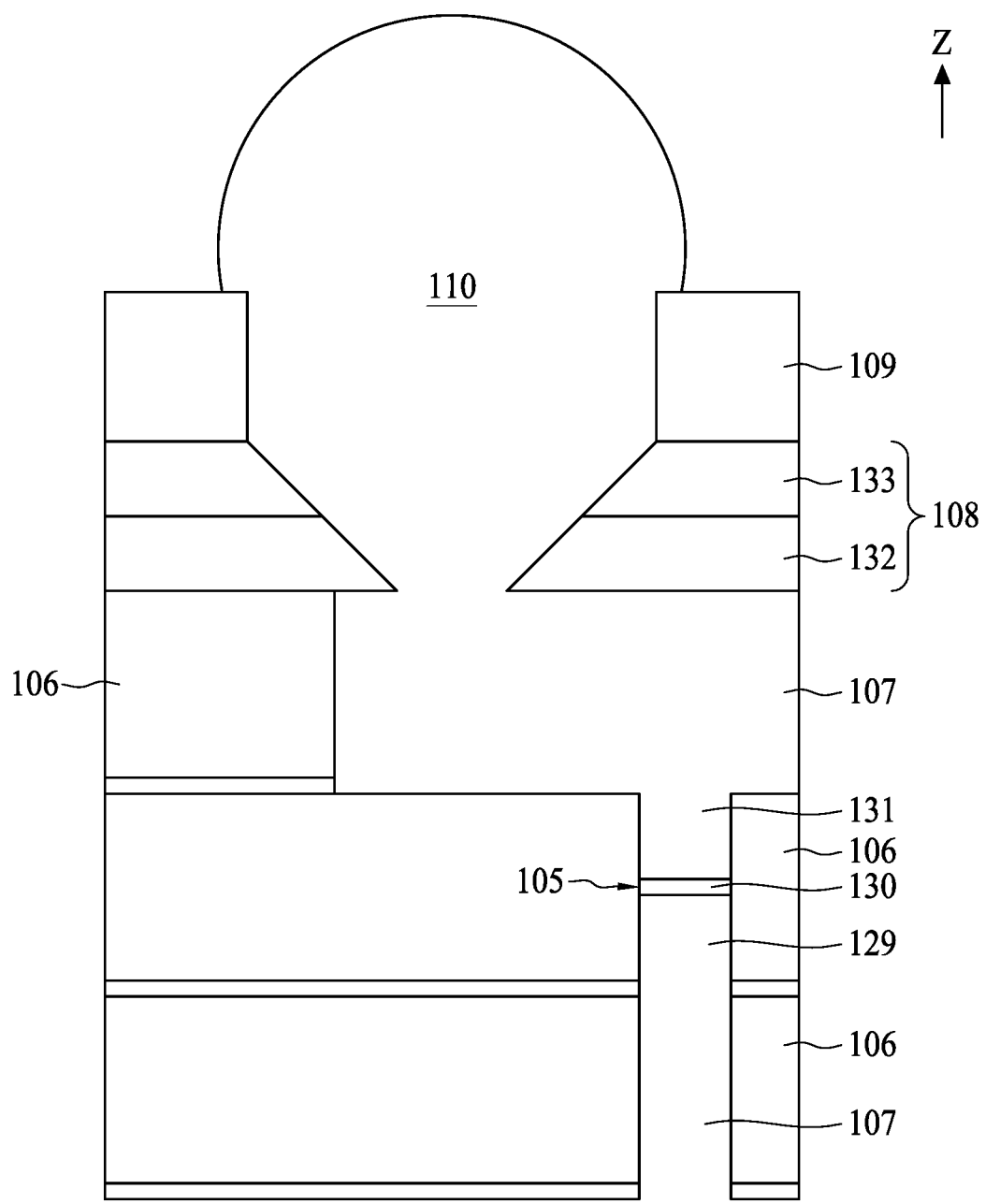

Note that, for convenience of explanation, FIG. 3 illustrates only a part of the semiconductor device.

With reference to FIG. 3, the programmable unit 105 is disposed in the second region 100B. The programmable unit 105 is disposed in one of the plurality of insulating layers 106 and is electrically coupled to some of the plurality of conductive layers 107 in the second region 100B. The programmable unit 105 is disposed at a vertical level higher than a vertical level of the first semiconductor element 102. In the embodiment depicted, the programmable unit 105 includes a first programmable conductive layer 129, a programmable insulating layer 130, and a second programmable conductive layer 131. The first programmable conductive layer 129, the programmable insulating layer 130, and the second programmable conductive layer 131 are stacked layer by layer. The first programmable conductive layer 129 is electrically connected to one of the plurality of conductive layers 106 which is at a vertical level lower than a vertical level of the first programmable conductive layer 129. The programmable insulating layer 130 is disposed on the first programmable conductive layer 129. The second programmable conductive layer 131 is disposed on the programmable insulating layer 130 and is electrically connected to another one of the plurality of conductive layers 106 which is at a vertical level higher than a vertical level of the second programmable conductive layer 131. The electrical connection between the first programmable conductive layer 129 and the second programmable conductive layer 131 is insulated by the programmable insulating layer 130.

The first programmable conductive layer 129 is formed of, for example, aluminum, copper, silver, gold, platinum, or alloys thereof. The second programmable conductive layer 131 is formed of, for example, aluminum, copper, silver, gold, platinum, or alloys thereof. The first programmable conductive layer 129 and the second programmable conductive layer 131 may be formed of the same material, but are not limited thereto. The programmable insulating layer 130 is formed of, for example, silicon oxide, silicon nitride, silicon oxynitride, silicon nitride oxide, aluminum oxide, tantalum oxide, titanium oxide, aluminum nitride, or the like. In the embodiment depicted, the first programmable conductive layer 129 and the second programmable conductive layer 131 are formed of copper and the programmable insulating layer 130 is formed of titanium oxide. A thickness of the programmable insulating layer 130 is about 0.5 nm to about 50 nm. However, the thickness of the programmable insulating layer 130 may be set to an arbitrary range depending on the circumstances.

With reference to FIG. 3, the passivation layer 108 is disposed above the plurality of conductive layers 107 and the plurality of insulating layers 106. In the embodiment depicted, the passivation layer 108 is disposed on a top one of the plurality of insulating layers 106 and a top one of the plurality of conductive layers 107. The passivation layer 108 may be formed as a stacked layer or a single layer using one or more of silicon oxide, silicon nitride, phosphosilica glass, or the like. In the embodiment depicted, the passivation layer 108 is formed as a stacked layer consisting of a phosphosilica glass layer 132 and a silicon nitride layer 133. The silicon nitride layer 133 may provide a high vapor barrier in order to prevent moisture from entering from above. The phosphosilica glass layer 132 may provide a stress buffer between the silicon nitride layer 133 and the top one of the plurality of insulating layers 106.

With reference to FIG. 3, the protection layer 109 is disposed above the passivation layer 108. In the embodiment depicted, the protection layer 109 is disposed on the silicon nitride layer 133 of the passivation layer 108. The protection layer 109 may be formed of polyimide. The protection layer 109 may protect the layers below the protection layer 109 from mechanical scratches or background radiation.

With reference to FIG. 3, the plurality of solder units 110 are disposed above the top one of the plurality of insulating layers 106 and the top one of the plurality of conductive layers 107 in both the first region 100A and the second region 100B. In the embodiment depicted, each of the plurality of solder units 110 passes through the protection layer 109, the silicon nitride layer 133, and the phosphosilica glass layer 132 to electrically and physically connect to the top one of the plurality of conductive layers 107. The plurality of solder units 110 are formed of, for example, tin-silver alloy, tin-copper alloy, or other lead-free material. In the embodiment depicted, the plurality of solder units 110 are formed of tin-copper alloy.

Figure 5:
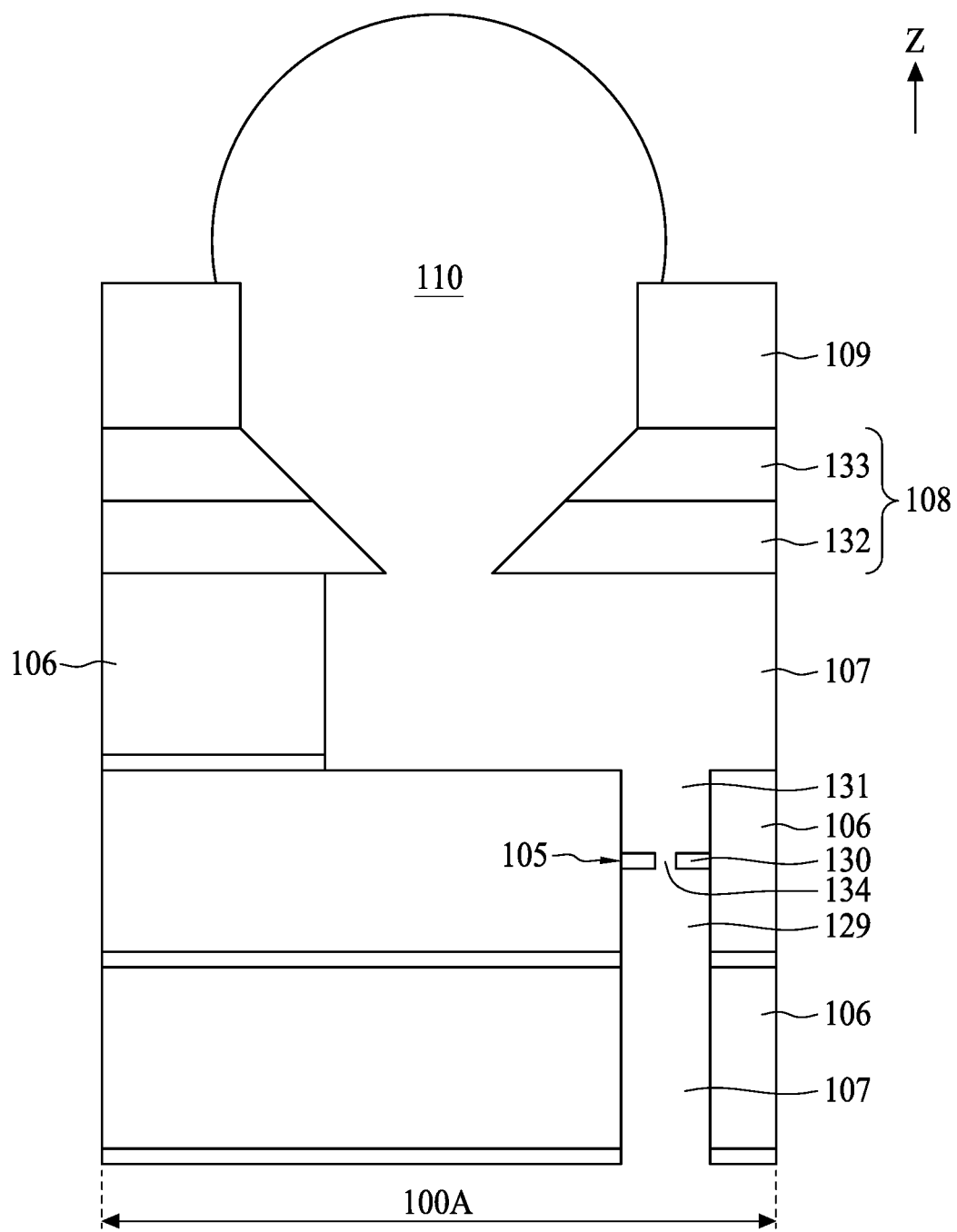
FIG. 5 illustrates, in a schematic cross-sectional diagram, a semiconductor device in accordance with one embodiment of the present disclosure after a programming procedure.

It should be noted that, for convenience of explanation, FIG. 5 illustrates only a part of the semiconductor device.

Figure 4:
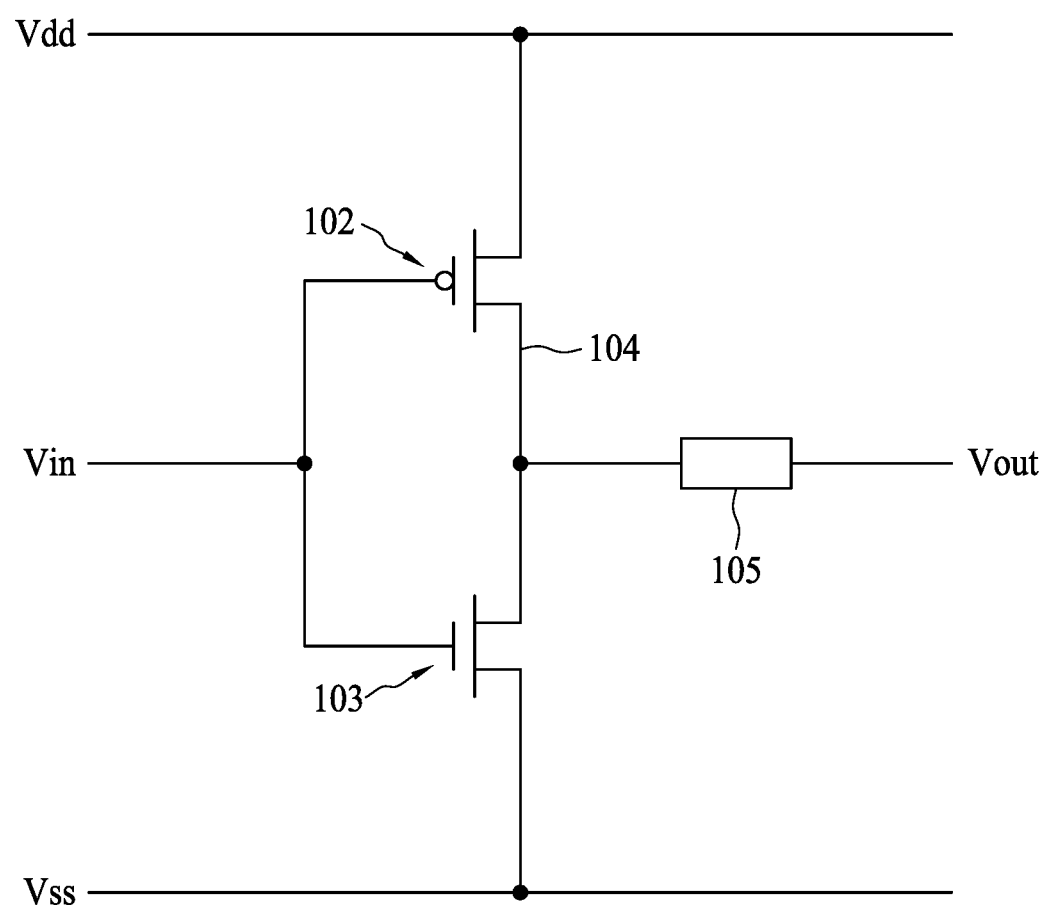
FIG. 4 illustrates, in a schematic circuit diagram, a semiconductor device in accordance with one embodiment of the present disclosure.

With reference to FIG. 4, in the embodiment depicted, the programmable unit 105 is electrically connected to the bridge conductive unit 104 and an output. With reference to FIG. 5, during a programming procedure, a programming voltage may be provided to the first programmable conductive layer 129, and the second programmable conductive layer 131 is grounded or held at the same potential as a potential of the substrate 100. Accordingly, the programmable unit 105 is blown by a current caused from the programming voltage, and a filament 134 may form in the programmable insulating layer 130. As a result, the first programmable conductive layer 129 and the second programmable conductive layer 131 may be electrically connected through the filament 134. Hence the output (Vout), the programmable unit 105, the bridge conductive unit 104, the first semiconductor element 102, and the second semiconductor element 103 are electrically connected after the programming procedure, and a user may overwrite the original result of the output by assigning a desired signal to the output. In addition, the electrical connection provided by the filament 134 through the programming procedure provides an option, to switch a circuit from off to on, which may allow a user to tune the electrical characteristics of the semiconductor device.

It should be noted that, for ease of explanation, FIGS. 7 to 16 illustrate only certain parts of the semiconductor device.

Figure 6:
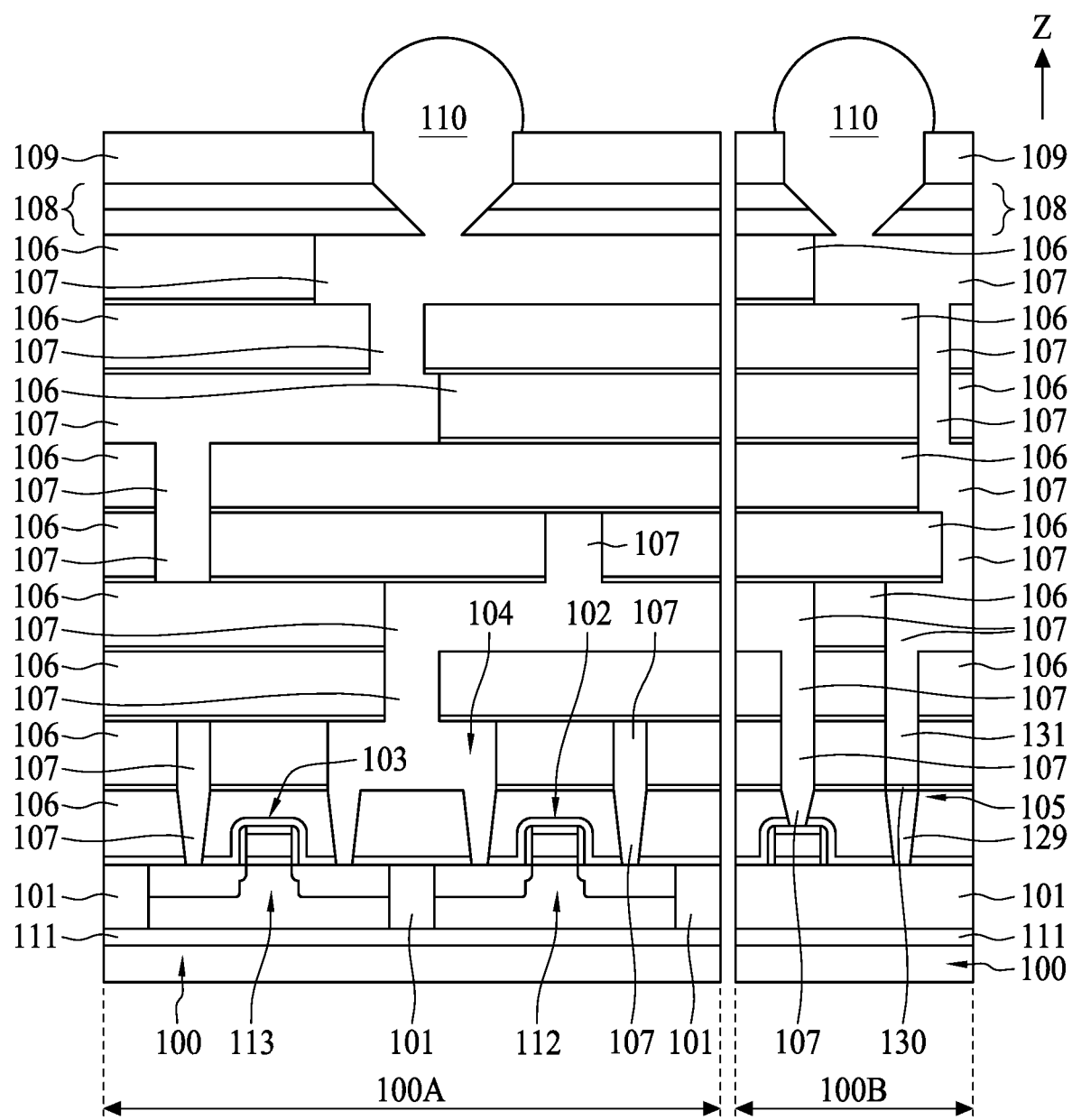
FIGS. 6 and 7 illustrate, in schematic cross-sectional diagrams, a semiconductor device in accordance with another embodiment of the present disclosure.
Figure 7:
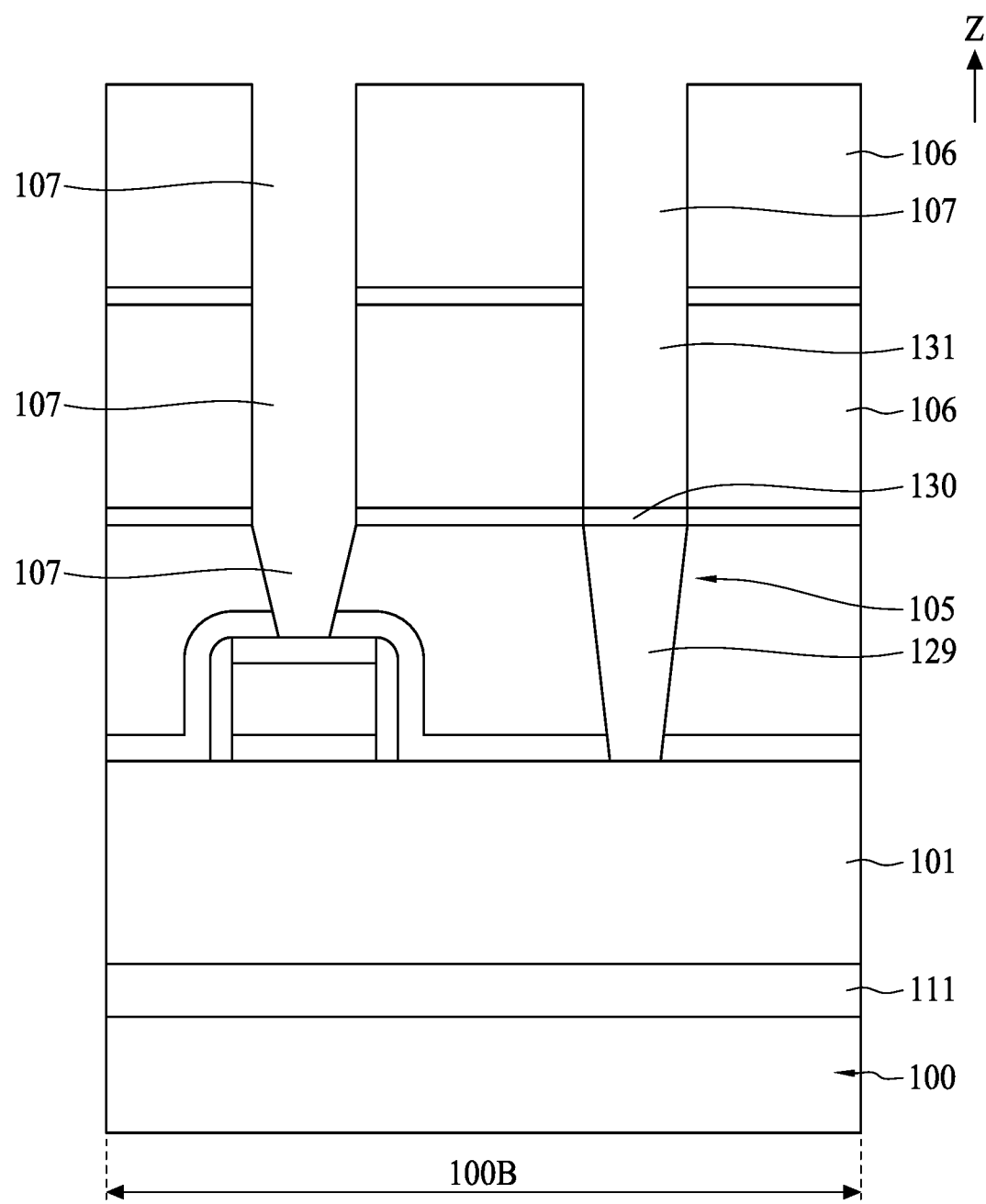
Figure 8:
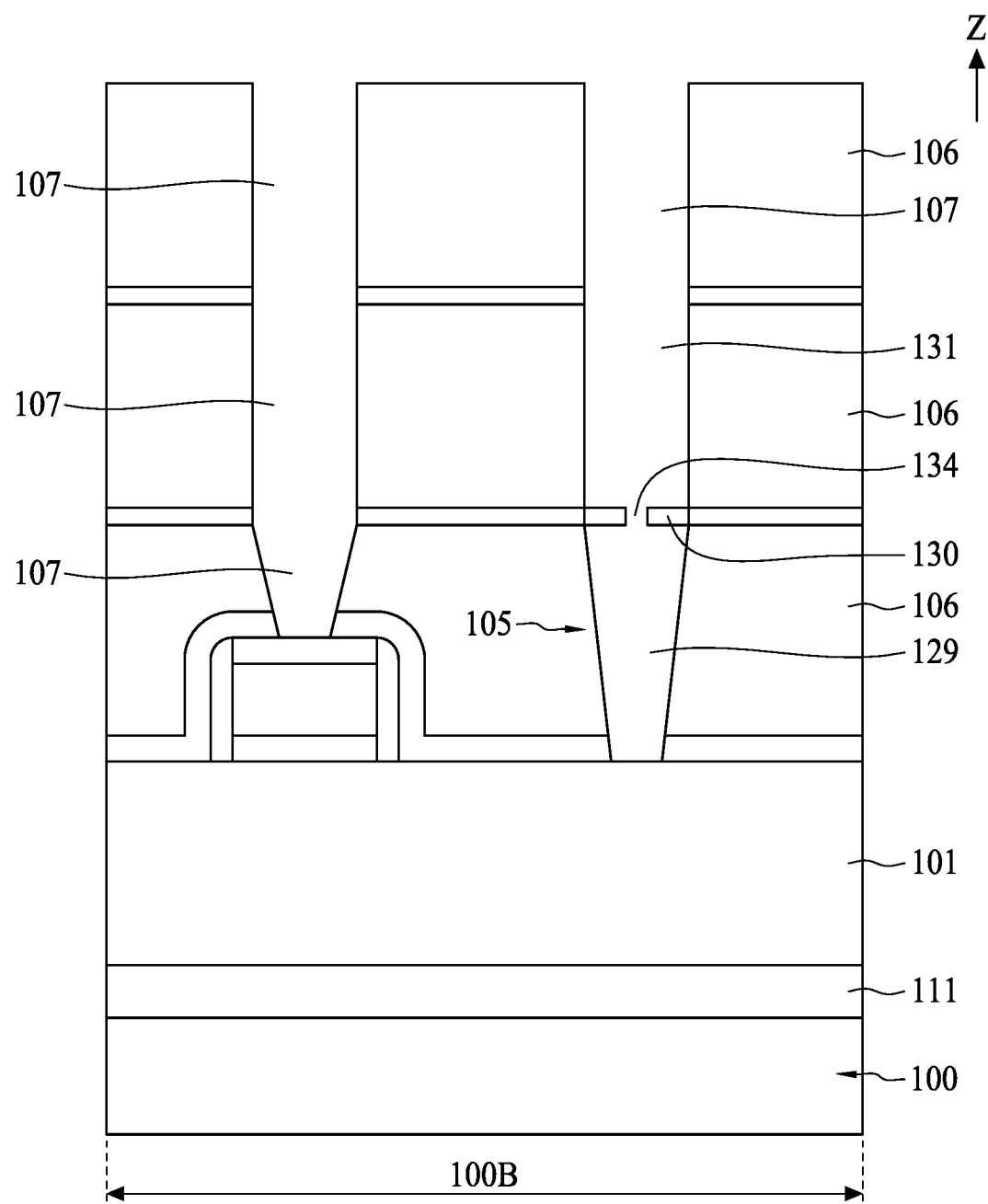
FIG. 8 illustrates, in a schematic cross-sectional diagram, a semiconductor device in accordance with another embodiment of the present disclosure after a programming procedure.

In another embodiment depicted, with reference to FIGS. 6 to 8, the programmable unit 105 is disposed at a vertical level even with a vertical level of the bridge conductive unit 104. The programmable unit 105 includes a first programmable conductive layer 129, a programmable insulating layer 130, and a second programmable conductive layer 131. The first programmable conductive layer 129 is disposed on one of the plurality of isolation structures 101 and is electrically connected to the bridge conductive unit 104. The programmable insulating layer 130 is disposed on the first programmable conductive layer 129. The second programmable conductive layer 131 is disposed on the programmable insulating layer 130. The electrical connection between the first programmable conductive layer 129 and the second programmable conductive layer 131 is insulated by the programmable insulating layer 130 (as shown in FIG. 7). After the completion of a programming procedure similar to the aforementioned programming procedure, the programmable unit 105 is blown and a filament 134 may form in the programmable insulating layer 130 (as shown in FIG. 8).

Figure 9:
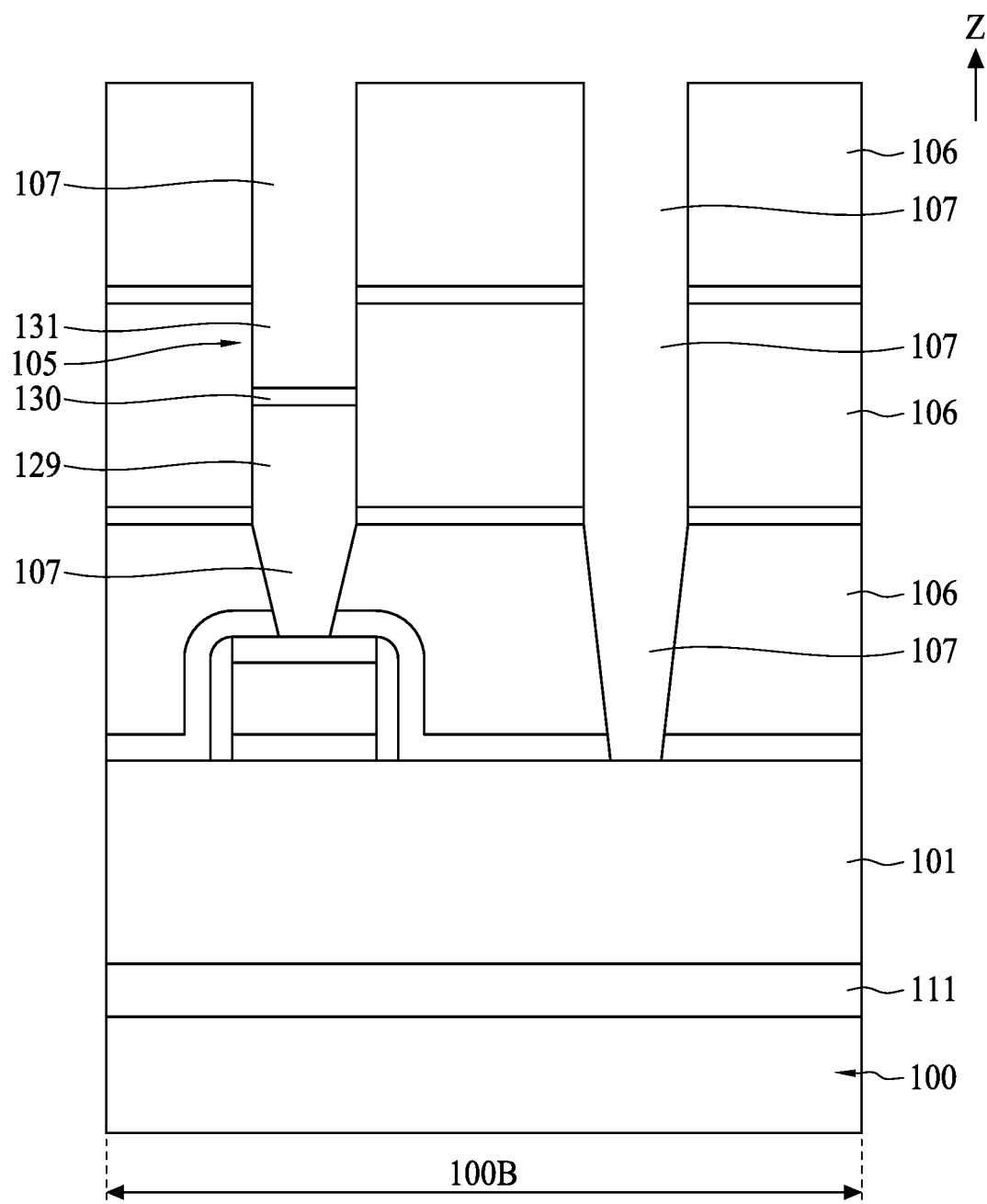
FIGS. 9 to 13 illustrate, in schematic cross-sectional diagrams, some semiconductor devices in accordance with several embodiments of the present disclosure.

Alternatively, in another embodiment depicted, with reference to FIG. 9, the programmable unit 105 is disposed above a dummy control structure disposed in the second region 100B and is electrically connected to the bridge conductive unit 104.

Figure 10:
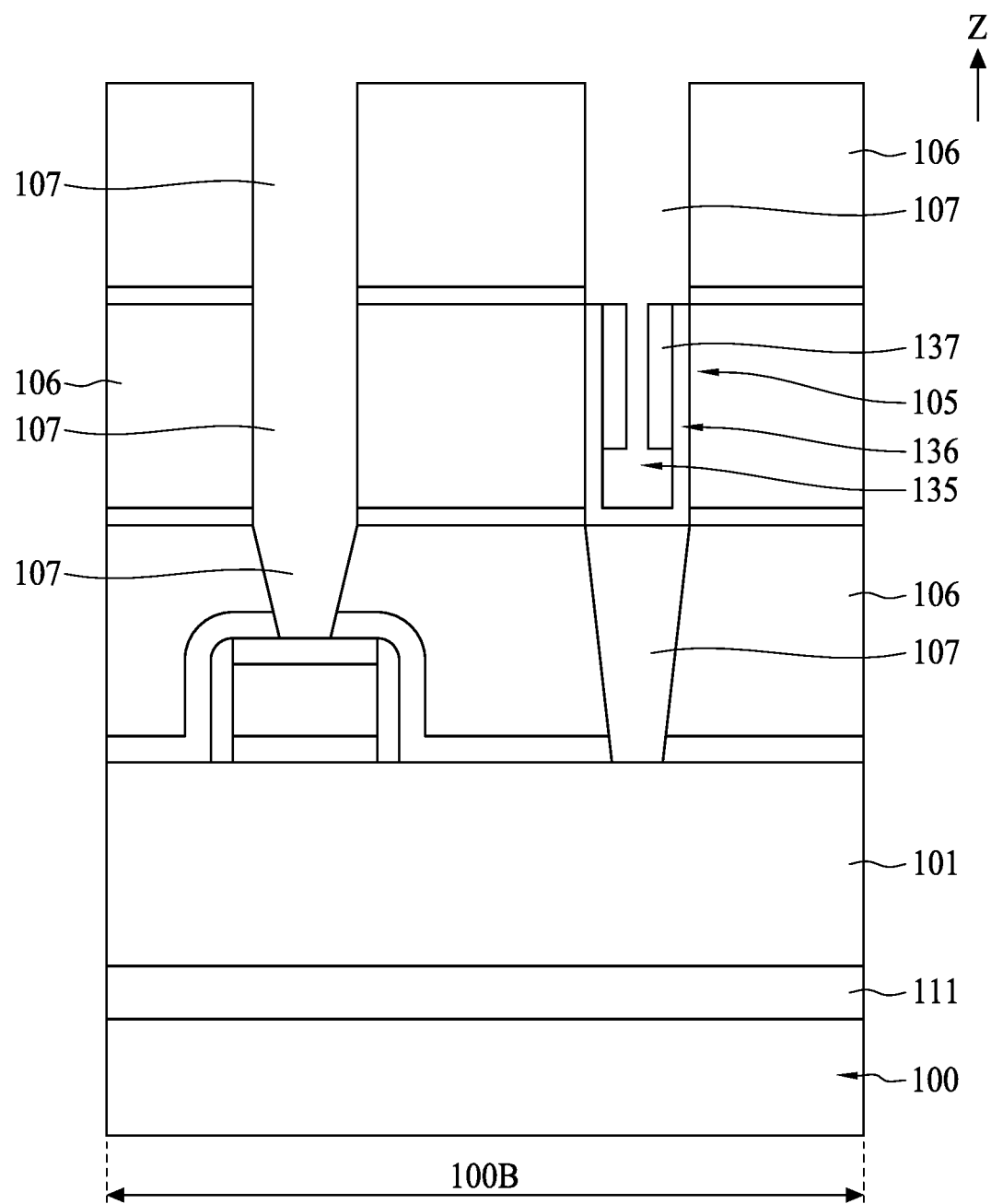
Figure 11:
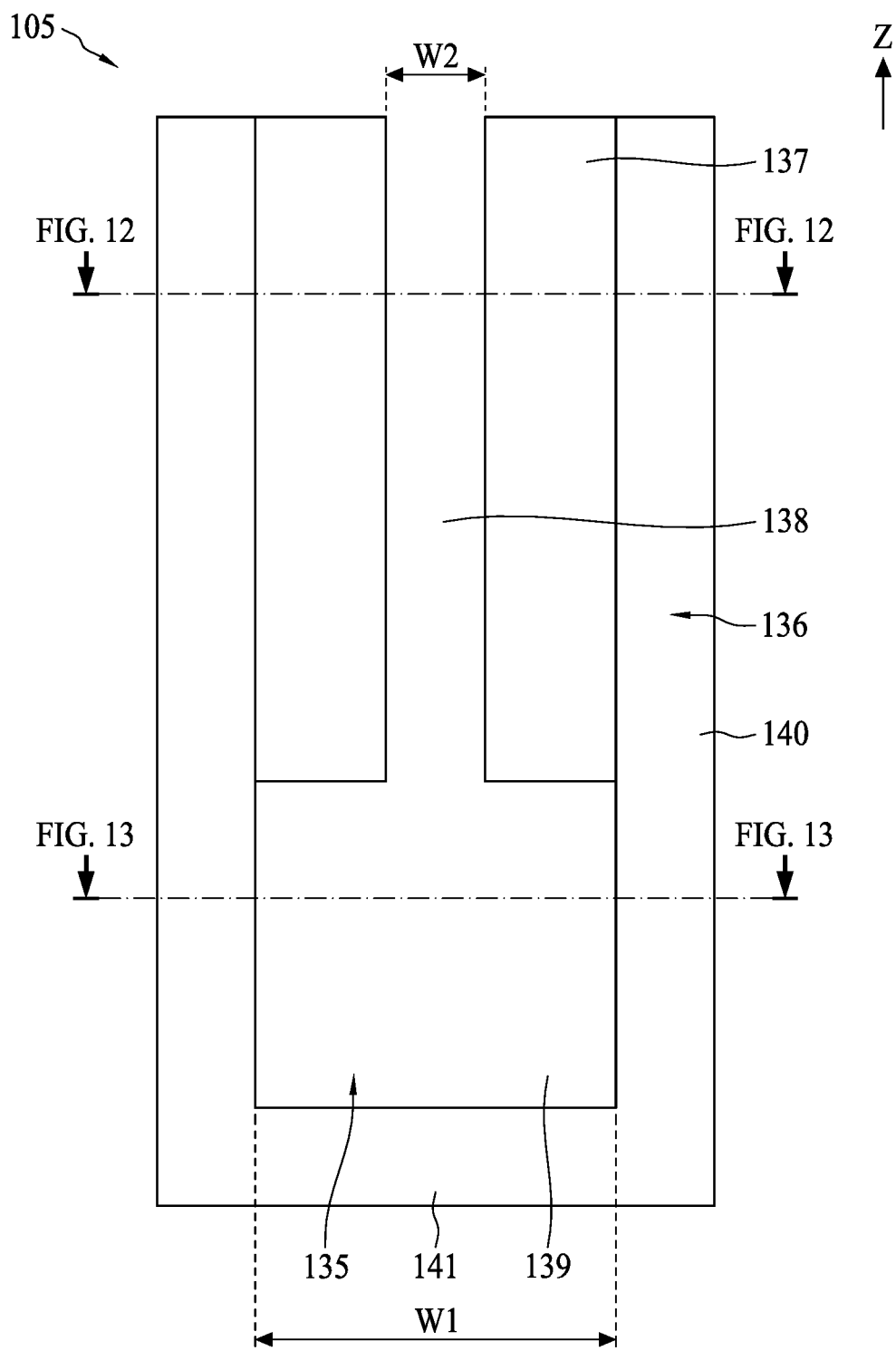
Figure 12:
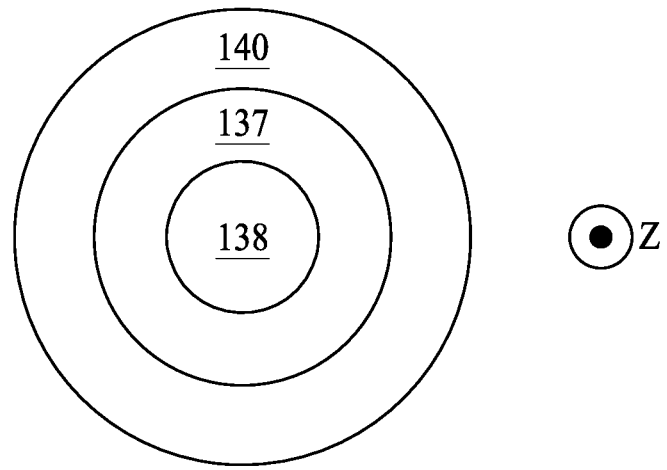
Figure 13:
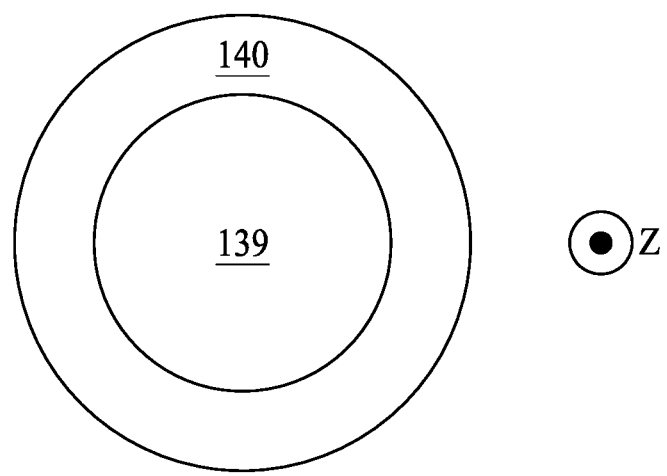
Figure 14:
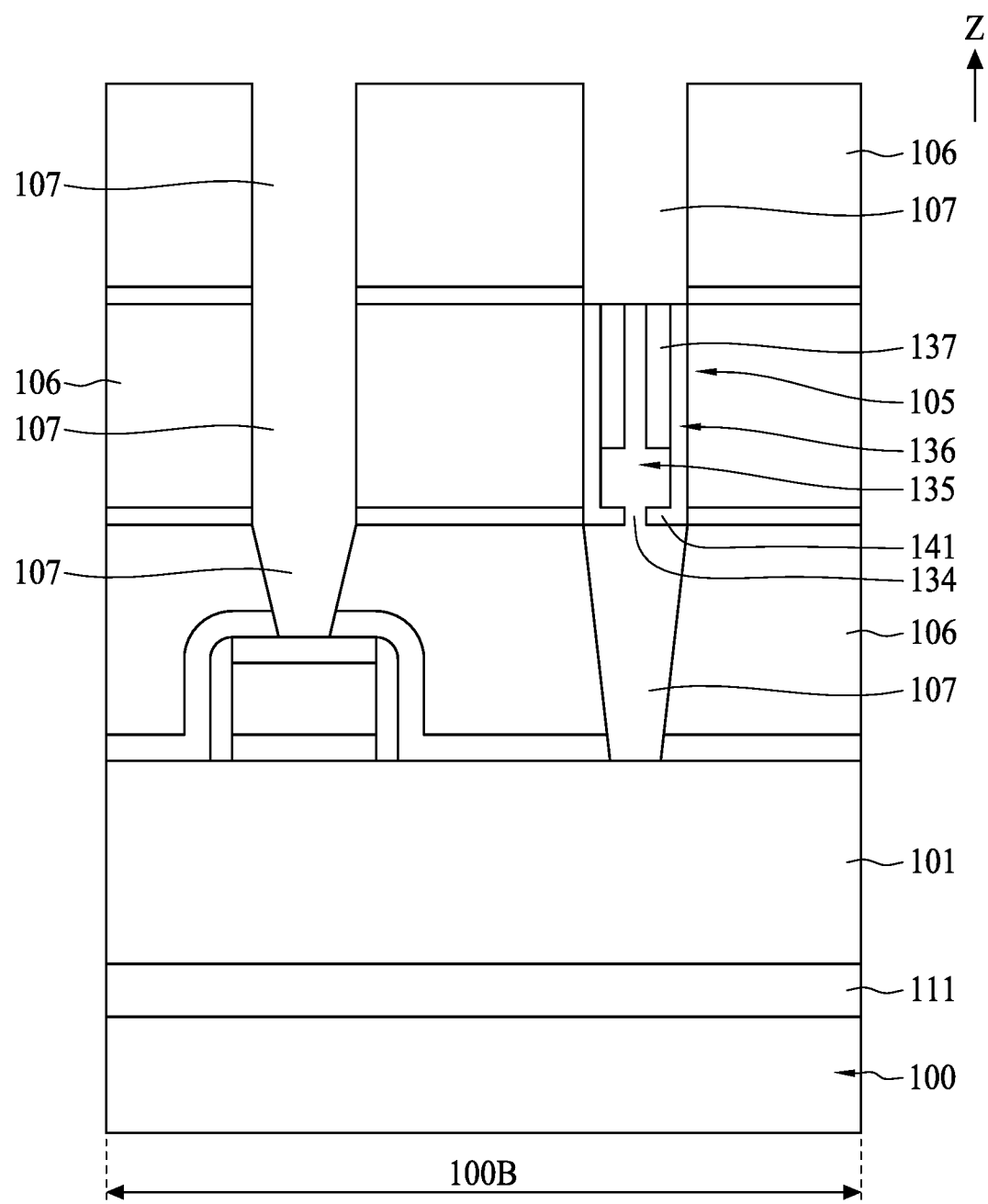
FIG. 14 illustrates, in a schematic cross-sectional diagram, a semiconductor device in accordance with another embodiment of the present disclosure after a programming procedure.

Alternatively, in another embodiment depicted, with reference to FIGS. 10 to 14, the programmable unit 105 includes a conductive plug 135, a first dielectric layer 136, and a second dielectric layer 137. The conductive plug 135 includes a top portion 138 and a bottom portion 139. The top portion 138 of the conductive plug 135 is disposed on the bottom portion 139 of the conductive plug 135 and is electrically connected to one of the plurality of conductive layers 107 above the conductive plug 135. The bottom portion 139 of the conductive plug 135 has a width W1 greater than a width W2 of the top portion 138 of the conductive plug 135. The second dielectric layer 137 encloses the top portion 138 of the conductive plug 135. The first dielectric layer 136 includes a vertical portion 140 and a horizontal portion 141. The vertical portion 140 of the first dielectric layer 136 encloses the bottom portion 139 of the conductive plug 135 and the second dielectric layer 137 and the vertical portion 140 is enclosed by one of the plurality of insulating layers 106. The horizontal portion 141 of the first dielectric layer 136 is disposed below the bottom portion 139 of the conductive plug 135 and is attached to the bottom of the vertical portion 140 of the first dielectric layer 136. The first dielectric layer 136 insulates the conductive plug 135 from the plurality of conductive layers 106 below the first dielectric layer 136 (as shown in FIG. 10). After the completion of a programming procedure similar to the programming procedure described above, the programmable unit 105 is blown and a filament 134 may form in the horizontal portion 141 of the first dielectric layer 136 (as shown in FIG. 14).

The top portion 138 of the conductive plug 135 and the bottom portion 139 of the conductive plug 135 are formed of, for example, tungsten, copper, doped polysilicon, other suitable materials, or alloys thereof. The top portion 138 and the bottom portion 139 may be formed of the same material, but are not limited thereto. The first dielectric layer 136 and the second dielectric layer 137 are formed of, for example, silicon oxide, silicon nitride, silicon oxynitride, silicon nitride oxide, aluminum oxide, tantalum oxide, titanium oxide, aluminum nitride, or the like. The first dielectric layer 136 and the second dielectric layer 137 may be formed of the same material, but are not limited thereto. A thickness of the horizontal portion 141 of the first dielectric layer 136 is about 0.5 nm to about 50 nm. In the embodiment depicted, the top portion 138 of the conductive plug 135 and the bottom portion 139 of the conductive plug 135 are formed of copper. The first dielectric layer 136 and the second dielectric layer 137 are formed of silicon oxide. The structure of the conductive plug 135 may enhance electric fields that accelerate dielectric breakdown of the horizontal portion 141 of the first dielectric layer 136.

Figure 15:
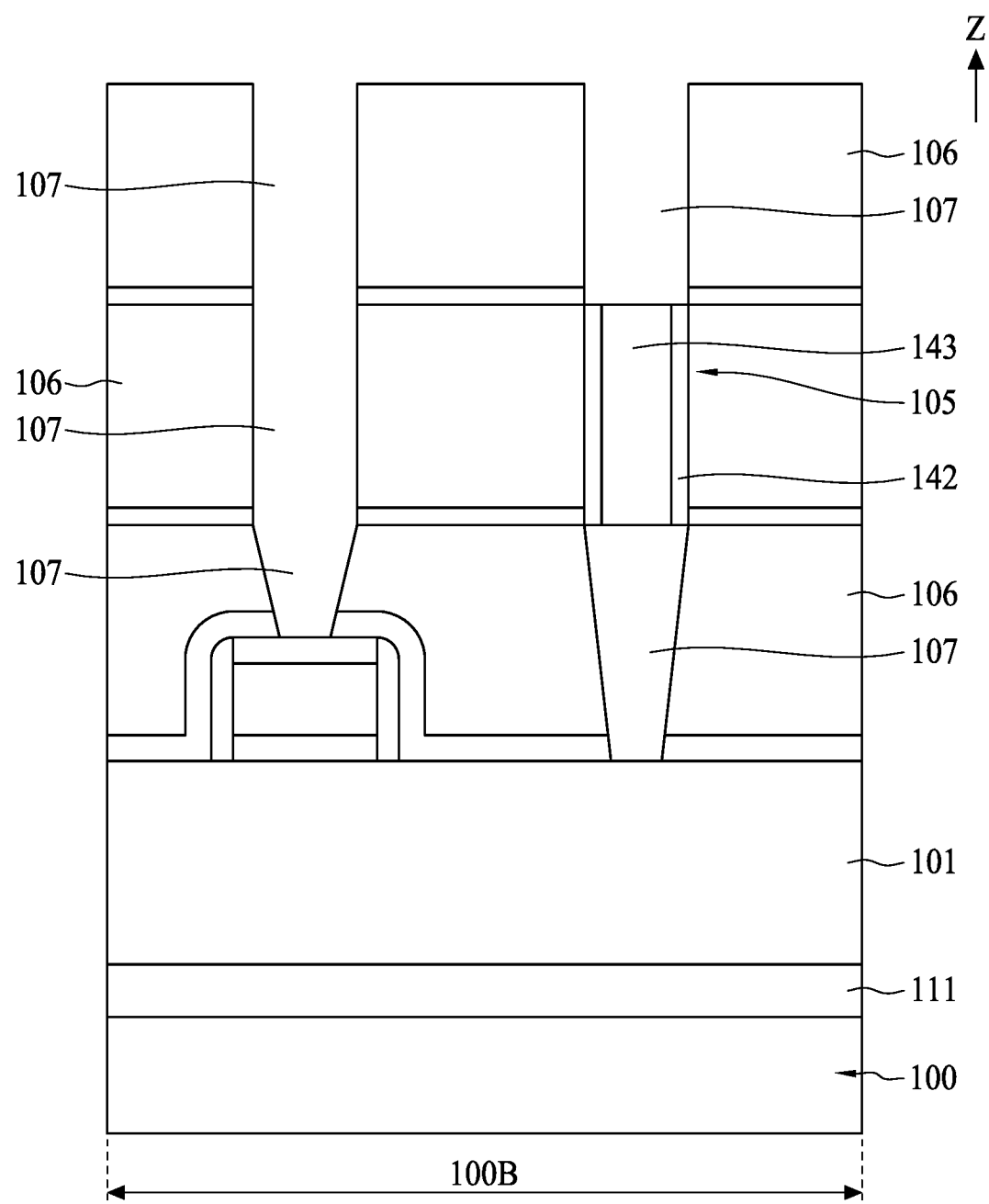
FIG. 15 illustrates, in a schematic cross-sectional diagram, a semiconductor device in accordance with another embodiment of the present disclosure.
Figure 16:
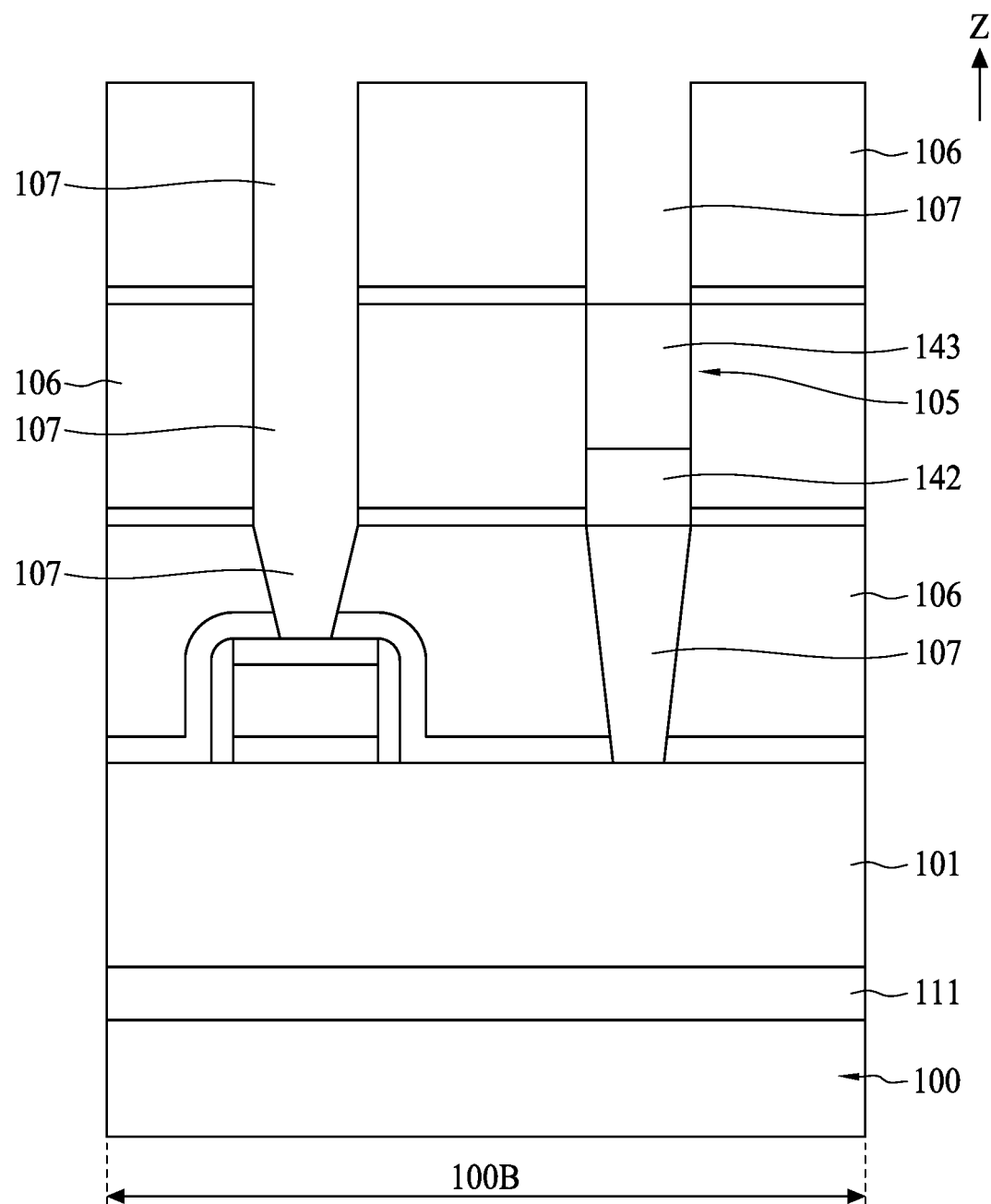
FIG. 16 illustrates, in a schematic cross-sectional diagram, a semiconductor device in accordance with another embodiment of the present disclosure after a programming procedure.
Figure 17:
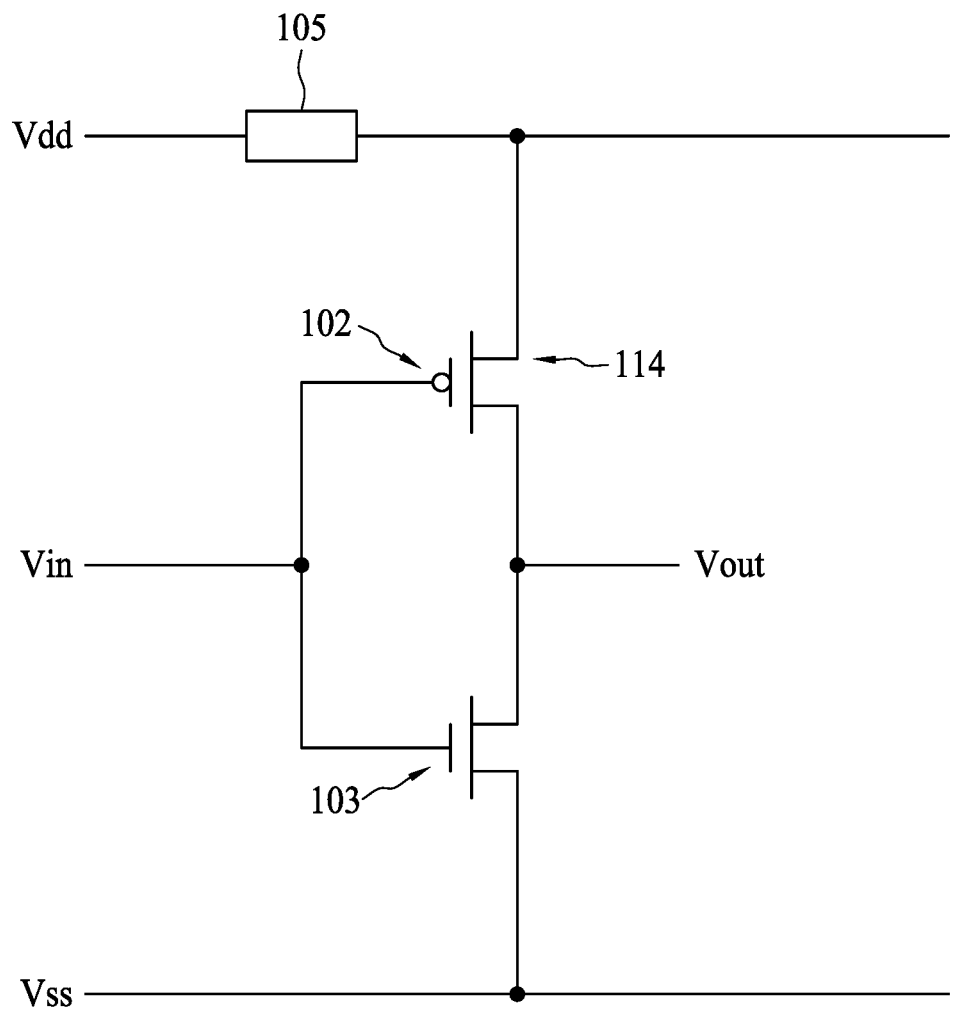
FIG. 17 illustrates, in a schematic circuit diagram, a semiconductor device in accordance with another embodiment of the present disclosure.

Alternatively, in another embodiment depicted, with reference to FIGS. 15 to 17, the programmable unit 105 is disposed in the second region 100B and is electrically connected to the first doped region 114 of the first semiconductor element 102. The programmable unit 105 includes a hollow conductive layer 142. The hollow conductive layer 142 is attached to a side wall of one of the plurality of insulating layers 106, and forms a cavity 143 between two of the plurality of conductive layers 107. The two of the plurality of conductive layers 107 are electrically connected through the hollow conductive layer 142. The hollow conductive layer 142 may be formed of a material with a resistivity greater than that of the material of the two of the plurality of conductive layers 107. For example, the hollow conductive layer 142 may be formed of titanium nitride.

With reference to FIGS. 15 to 17, during a programming procedure, a programming current may be provided to the hollow conductive layer 142 and to blow the programmable unit 105 by melting the hollow conductive layer 142. As a result, the cavity 143 may insulate the two of the plurality of conductive layers 107. With reference to FIG. 17, the programmable unit 105 may be electrically coupled to a drain voltage; therefore, the insulation feature of the cavity 143 after the programming procedure provides an option for a user to tune the electrical characteristics of the semiconductor device by switching a circuit from on to off.

Figure 18:
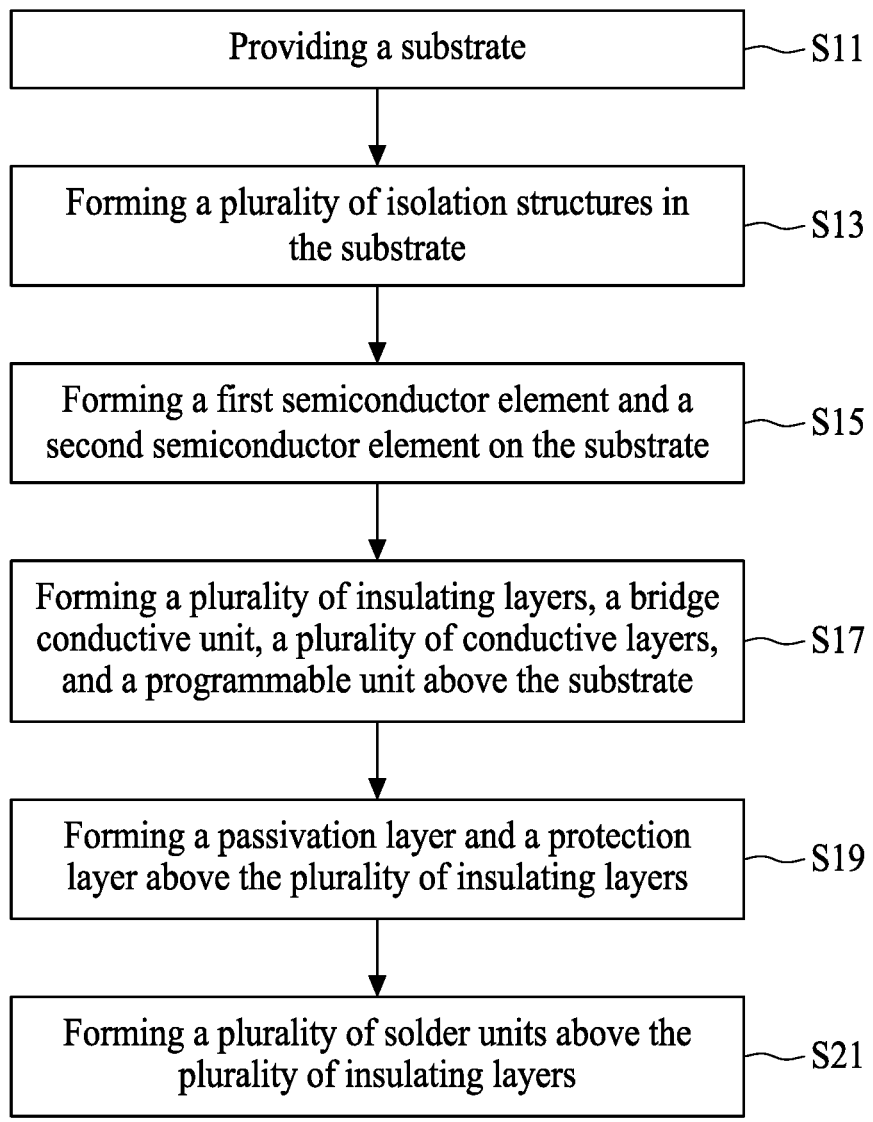
FIG. 18 illustrates, in flowchart diagram form, a method for fabricating a semiconductor device in accordance with one embodiment of the present disclosure.
Figure 19:
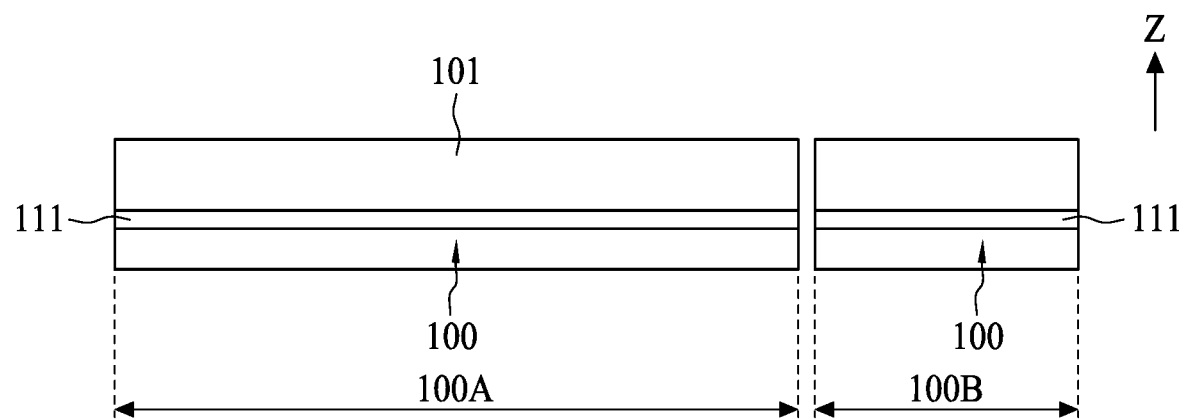
FIGS. 19 to 23 illustrate, in schematic cross-sectional diagrams, a flow of fabricating a semiconductor device in accordance with one embodiment of the present disclosure.

With reference to FIG. 18 and FIG. 19, at step S11, a substrate 100 is provided. The substrate 100 includes, for example, a first region 100A and a second region 100B. The first region 100A and the second region 100B may be adjacent to or spaced apart from each other. The substrate 100 is formed of, for example, bulk silicon or silicon on insulator. In the embodiment depicted, the substrate 100 is formed of silicon on insulator with an insulating film 111.

Figure 20:
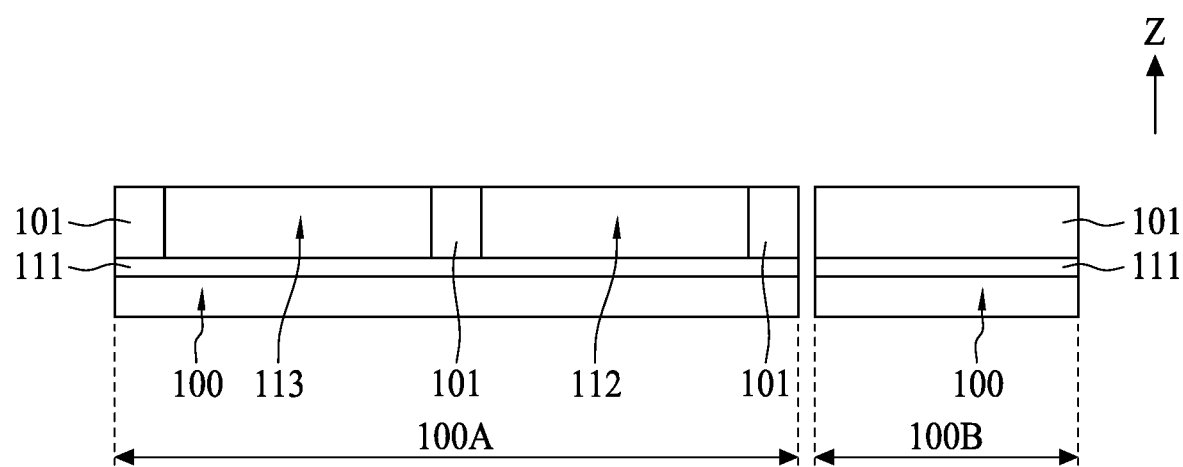

With reference to FIG. 18 and FIG. 20, at step S13, the plurality of isolation structures 101 are respectively formed in the first region 100A and the second region 100B of the substrate 100. The plurality of isolation structures 101 are formed above the insulating film 111. Some of the plurality of isolation structures 101 are separate from each other and define a first active area 112 and a second active area 113 of the first region 100A. The plurality of isolation structures 101 are formed of, for example, an insulating material such as silicon oxide, silicon nitride, silicon oxynitride, silicon nitride oxide, fluoride-doped silicate, or the like. The plurality of isolation structures 101 may be shallow trench isolation structures. In the embodiment depicted, the plurality of isolation structures 101 are formed of silicon oxide. The first active area 112 may be doped with a dopant such as phosphorus, arsenic, or antimony. The second active area 113 may be doped with a dopant such as boron.

Figure 21:
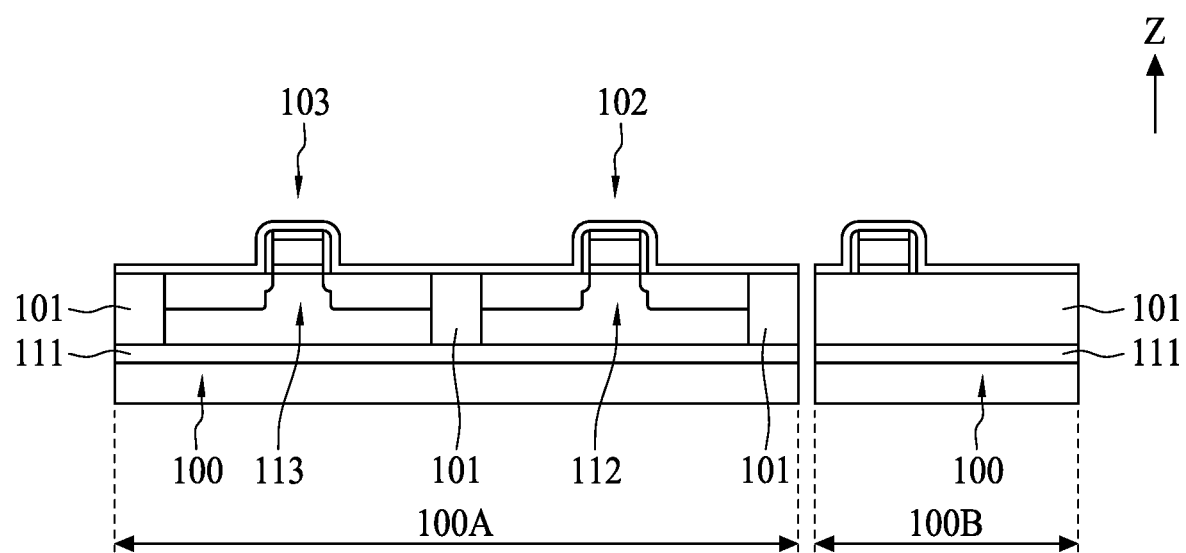

With reference to FIG. 18 and FIG. 21, at step S15, a first semiconductor element 102 and a second semiconductor element 103 are formed on the first active area 112 and the second active area 113, respectively. The first semiconductor element 102 includes a control structure, a first doped region 114, a second doped region 115, and two spacers 116. The control structure of the first semiconductor element 102 includes a gate insulating layer 117, a gate middle layer 118, and a gate top layer 119. The gate insulating layer 117 is disposed on the substrate 100 and has two sides. The gate middle layer 118 is disposed on the gate insulating layer 117. The gate top layer 119 is disposed on the gate middle layer 118. The first doped region 114 is disposed in the first active area 112 and is adjacent to one of the two sides of the gate insulating layer 117. The second doped region 115 is disposed in the first active area 112 and is adjacent to the other one of the two sides of the gate insulating layer 117. The first doped region 114 and the second doped region 115 are separate from each other. Each of the two spacers 116 is attached to one of the two sides of the control structure of the first semiconductor element 102.

The gate insulating layer 117 is formed of, for example, silicon oxide, silicon oxynitride, silicon nitride oxide, silicon nitride, or the like. In the embodiment depicted, the gate insulating layer 117 is formed of silicon oxide. The first doped region 114 and the second doped region 115 may be doped by a dopant which is different from the dopant used to dope the first active area 112. In the embodiment depicted, the first doped region 114 and the second doped region 115 are doped by boron. The two spacers 116 are formed of, for example, silicon oxide, silicon nitride, or the like. In the embodiment depicted, the two spacers 116 are formed of silicon oxide.

With reference to FIG. 18 and FIG. 21, the second semiconductor element 103 includes a control structure, a first doped region 120, a second doped region 121, and two spacers 122. The control structure of the second semiconductor element 103 includes a gate insulating layer 123, a gate middle layer 124, and a gate top layer 125. The gate insulating layer 123 is disposed on the substrate 100 and has two sides. The gate middle layer 124 is disposed on the gate insulating layer 123. The gate top layer 125 is disposed on the gate middle layer 124. The first doped region 120 is disposed in the second active area 113 and is adjacent to one of the two sides of the gate insulating layer 123. The second doped region 121 is disposed in the second active area 113 and is adjacent to the other one of the two sides of the gate insulating layer 123. The first doped region 120 and the second doped region 121 are separate from each other. Each of the two spacers 122 is attached to one of the two sides of the control structure of the second semiconductor element 103.

The gate insulating layer 123 is formed of, for example, silicon oxide, silicon oxynitride, silicon nitride oxide, silicon nitride, or the like. In the embodiment depicted, the gate insulating layer 123 is formed of silicon oxide. The gate middle layer 124 may be formed of polysilicon. The gate top layer 125 may be formed of metal silicide such as nickel silicide, platinum silicide, titanium silicide, molybdenum silicide, cobalt silicide, tantalum silicide, tungsten silicide, or the like. The first doped region 120 and the second doped region 121 may be doped by a dopant which is different from the dopant used to dope the second active area 113. In the embodiment depicted, the first doped region 120 and the second doped region 121 are doped by phosphorus. The two spacers 122 are formed of, for example, silicon oxide, silicon nitride, or the like. In the embodiment depicted, the two spacers 122 are formed of silicon oxide.

Figure 22:
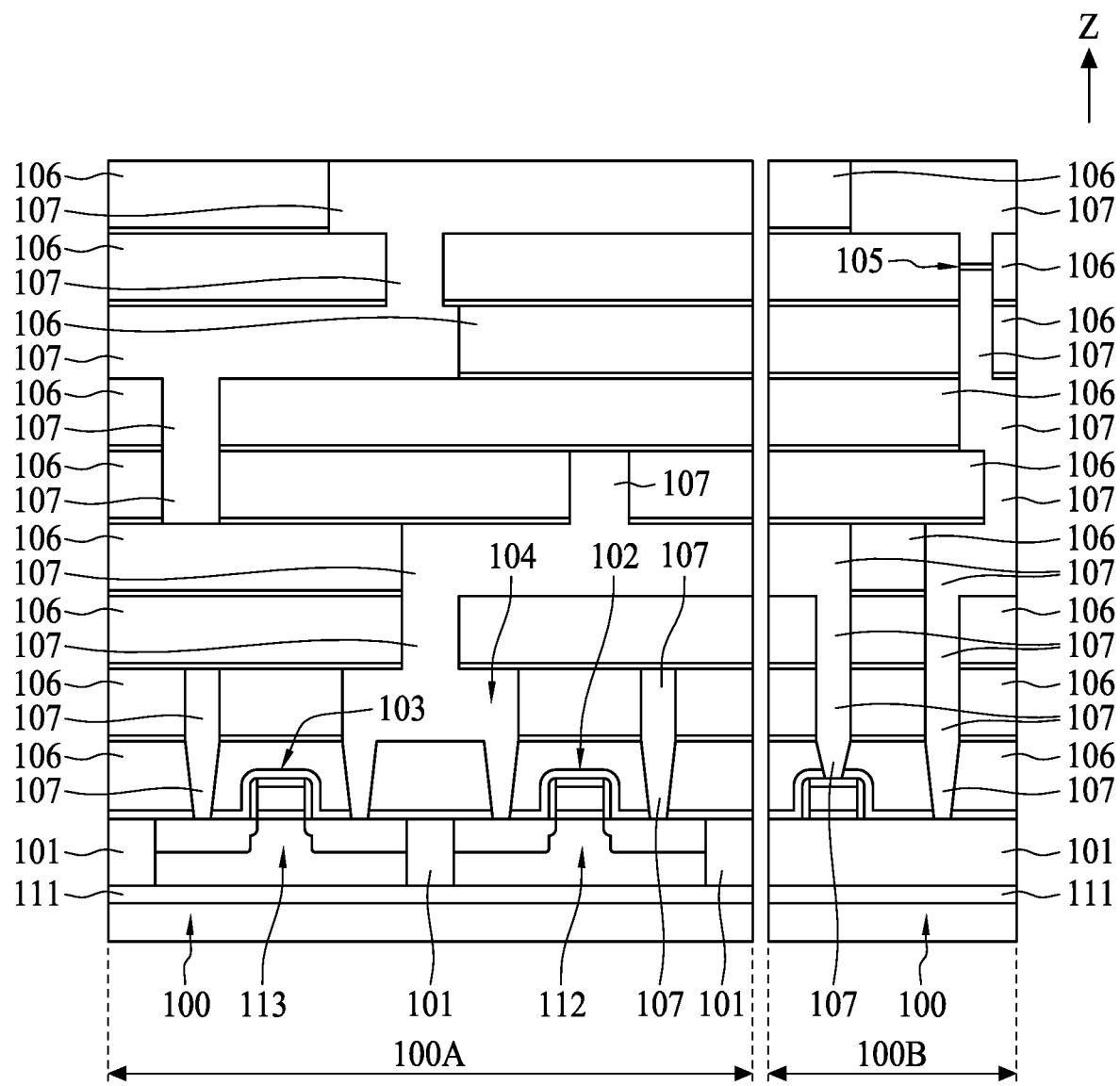

With reference to FIG. 18 and FIG. 22, at step S17, a plurality of insulating layers 106, a bridge conductive unit 104, a plurality of conductive layers 107, and a programmable unit 105 are formed above the substrate 100. The plurality of insulating layers 106 are stacked on the substrate 100 layer by layer in both the first region 100A and the second region 100B. The plurality of insulating layers 106 may be formed of silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but are not limited thereto.

With reference to FIG. 18 and FIG. 22, the bridge conductive unit 104 is formed in a bottom one of the plurality of insulating layers 106. The bridge conductive unit 104 is electrically connected to the second doped region 115 of the first semiconductor element 102 and the first doped region 120 of the second semiconductor element 103. The bridge conductive unit 104 is formed of, for example, tungsten, aluminum, copper, or copper alloy. The copper alloy may be formed of copper and at least one of the elements selected from the group consisting of carbon, silver, zinc, aluminum, titanium, cobalt, tantalum, indium, tin, zinc, manganese, magnesium, chromium, germanium, strontium, platinum, and zirconium.

With reference to FIG. 18 and FIG. 22, the plurality of conductive layers 107 are formed among the plurality of insulating layers 106 in both the first region 100A and the second region 100B. The plurality of conductive layers 107 in the first region 100A and the plurality of conductive layers 107 in the second region 100B are electrically connected. The bottom two of the plurality of conductive layers 107 are electrically and physically connected respectively to the first doped region 114 of the first semiconductor element 102 and the second doped region 121 of the second semiconductor element 103. The plurality of conductive layers 107 are formed of, for example, aluminum, tungsten, copper, or copper alloy. The copper alloy may be formed of copper and at least one of the elements selected from the group consisting of carbon, silver, zinc, aluminum, titanium, cobalt, tantalum, indium, tin, zinc, manganese, magnesium, chromium, germanium, strontium, platinum, and zirconium.

With reference to FIG. 18 and FIG. 22, the programmable unit 105 is formed in one of the plurality of insulating layers 106 in the second region 100B. The programmable unit 105 is electrically coupled to some of the plurality of conductive layers 107 in the second region 100B. In the embodiment depicted, the programmable unit 105 includes a first programmable conductive layer 129, a programmable insulating layer 130, and a second programmable conductive layer 131. The first programmable conductive layer 129, the programmable insulating layer 130, and the second programmable conductive layer 131 are stacked layer by layer. The first programmable conductive layer 129 is electrically connected to one of the plurality of conductive layers 106, which is at a vertical level lower than a vertical level of the first programmable conductive layer 129. The programmable insulating layer 130 is disposed on the first programmable conductive layer 129. The second programmable conductive layer 131 is disposed on the programmable insulating layer 130 and is electrically connected to another one of the plurality of conductive layers 106, which is at a vertical level higher than a vertical level of the second programmable conductive layer 131. The electrical connection between the first programmable conductive layer 129 and the second programmable conductive layer 131 is insulated by the programmable insulating layer 130.

The first programmable conductive layer 129 is formed of, for example, aluminum, copper, silver, gold, platinum, or alloys thereof. The second programmable conductive layer 131 is formed of, for example, aluminum, copper, silver, gold, platinum, or alloys thereof. The first programmable conductive layer 129 and the second programmable conductive layer 131 may be formed of the same material, but are not limited thereto. The programmable insulating layer 130 is formed of, for example, silicon oxide, silicon nitride, silicon oxynitride, silicon nitride oxide, aluminum oxide, tantalum oxide, titanium oxide, aluminum nitride, or the like. In the embodiment depicted, the first programmable conductive layer 129 and the second programmable conductive layer 131 are formed of copper and the programmable insulating layer 130 is formed of titanium oxide. A thickness of the programmable insulating layer 130 is about 0.5 nm to about 50 nm. However, the thickness may be set to an arbitrary range depending on the circumstances.

Figure 23:
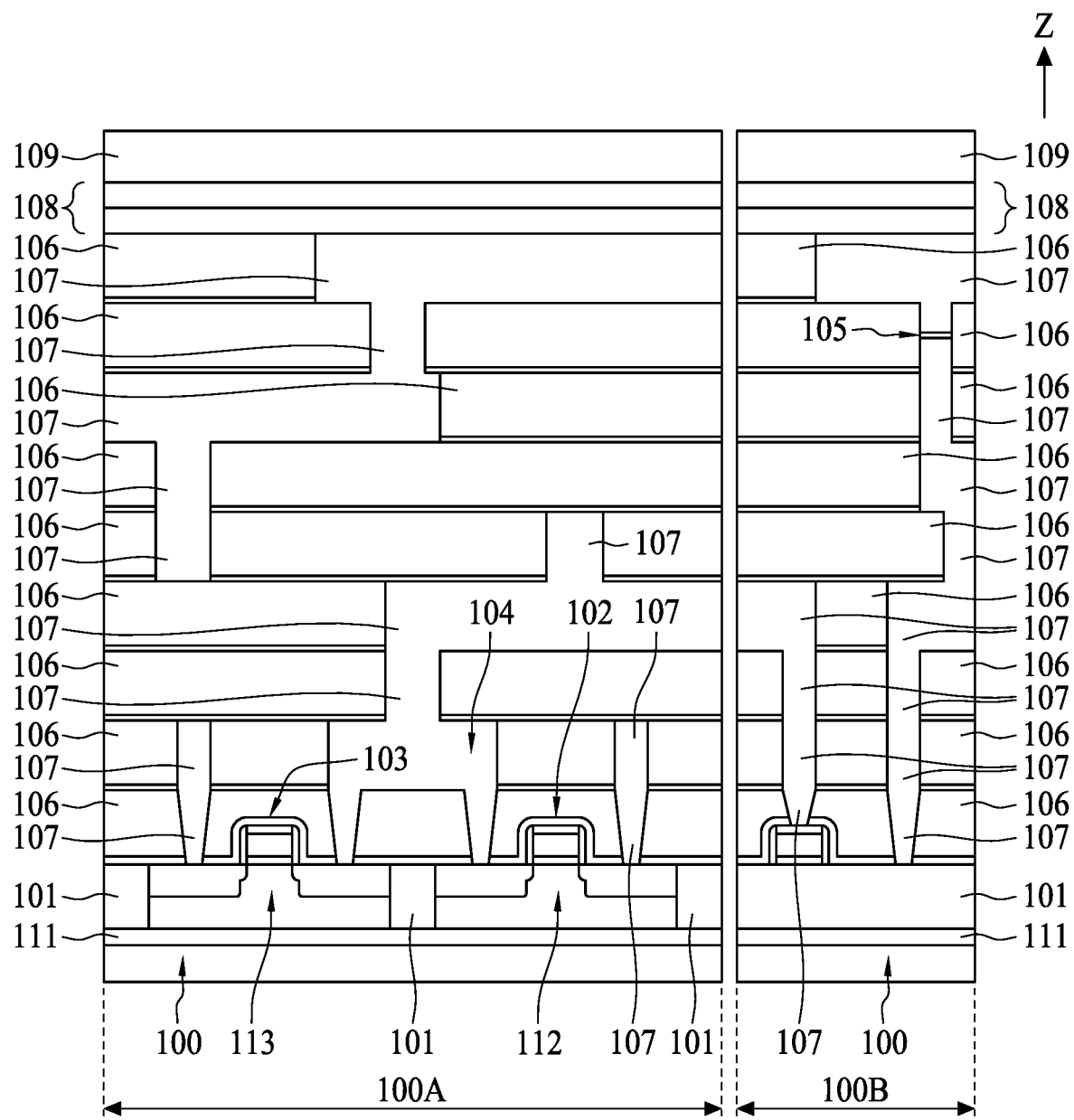

With reference to FIG. 18 and FIG. 23, at step S19, a passivation layer 108 and a protection layer 109 are formed above the plurality of insulating layers 106. In the embodiment depicted, the passivation layer 108 is disposed on a top one of the plurality of insulating layers 106 and a top one of the plurality of conductive layers 107. The passivation layer 108 may be formed as a stacked layer or a single layer using one or more of silicon oxide, silicon nitride, phosphosilica glass, and the like. In the embodiment depicted, the passivation layer 108 is formed as a stacked layer consisting of a phosphosilica glass layer 132 and a silicon nitride layer 133. The silicon nitride layer 133 may provide a high vapor barrier in order to prevent moisture from entering from above. The phosphosilica glass layer 132 may provide a stress buffer between the silicon nitride layer 133 and the top one of the plurality of insulating layers 106. The protection layer 109 is disposed above the passivation layer 108. In the embodiment depicted, the protection layer 109 is disposed on the silicon nitride layer 133 of the passivation layer 108. The protection layer 109 may be formed of polyimide. The protection layer 109 may protect the layers below the protection layer 109 from mechanical scratches or background radiation.

With reference to FIG. 1 and FIG. 18, at step S212, a plurality of solder units are formed above the plurality of insulating layers 106 and are electrically connected to the plurality of conductive layers 107. In the embodiment depicted, each of the plurality of solder units 110 extends through the protection layer 109, the silicon nitride layer 133, and the phosphosilica glass layer 132 to electrically and physically connect to the top one of the plurality of conductive layers 106. The plurality of solder units 110 are formed of, for example, tin-silver alloy, tin-copper alloy, or other lead-free material. In the embodiment depicted, the plurality of solder units 110 are formed of tin-copper alloy.

Due to the design of the semiconductor device of the present disclosure, a user may control or overwrite signal status through the programming procedure. In addition, a user may also tune the electrical characteristics of the semiconductor device through the programming procedure. Therefore, the quality of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device; comprising:
   a substrate comprising a first region and a second region;
   a first semiconductor element positioned in the first region of the substrate;
   a second semiconductor element positioned in the first region of the substrate;
   a bridge conductive unit electrically connected to the first semiconductor element and the second semiconductor element; and
   a programmable unit positioned in the second region and electrically connected to the bridge conductive unit;
   wherein the programmable unit comprises a first programmable conductive layer, a programmable insulating layer, and a second programmable conductive layer, the first programmable conductive layer is electrically connected to the bridge conductive unit, the programmable insulating layer is positioned above the first programmable conductive layer, and the second programmable conductive layer is positioned above the programmable insulating layer,
   wherein the bridge conductive unit is interposed between the first and second semiconductor elements.

2. The semiconductor device of claim 1, wherein the first programmable conductive layer is formed of aluminum, copper, silver, gold, platinum, or alloys thereof.

3. The semiconductor device of claim 1, wherein the programmable insulating layer is formed of silicon oxide, silicon nitride, silicon oxynitride, silicon nitride oxide, aluminum oxide, tantalum oxide, titanium oxide, or aluminum nitride.

4. The semiconductor device of claim 1, wherein a thickness of the programmable insulating layer is about 0.5 nm to about 50 nm.

5. The semiconductor device of claim 1, wherein the programmable unit is positioned at a vertical level higher than a vertical level of the first semiconductor element.

6. The semiconductor device of claim 1, wherein the bridge conductive unit is formed of aluminum, tungsten, copper, or copper alloy.

7. The semiconductor device of claim 1, wherein the substrate is formed of bulk silicon or silicon on insulator.

8. The semiconductor device of claim 1, wherein the first region is adjacent to the second region.

* * * * *